(12) United States Patent  (10) Patent No.: US 9,401,222 B1
Eckert et al.  (45) Date of Patent: Jul. 26, 2016

(54) DETERMINING CATEGORIES FOR MEMORY FAIL CONDITIONS

(71) Applicant: International Business Machines Corporation, Armonk, NY (US)

(72) Inventors: Martin Eckert, Moetzingen (DE); Nils Schlemminger, Sindelfingen (DE); Otto A. Torreiter, Leinfelden-Echterdingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/948,743

(22) Filed: Nov. 23, 2015

(51) Int. Cl.
   *G11C 29/10*  (2006.01)
   *G01R 31/3181*  (2006.01)

(52) U.S. Cl.
   CPC .......... *G11C 29/10* (2013.01); *G01R 31/31813* (2013.01)

(58) Field of Classification Search
   CPC ........................ G11C 29/10; G01R 31/31813
   USPC ................................ 714/710, 711, 718–723
   See application file for complete search history.

(56) References Cited

U.S. PATENT DOCUMENTS

| | | | |
|---|---|---|---|
| 4,862,071 A * | 8/1989 | Sato ................. | G01R 19/16557 324/537 |
| 5,771,243 A | 6/1998 | Lee et al. | |
| 5,844,850 A * | 12/1998 | Tsutsui .................... | H01L 22/20 257/E21.525 |
| 6,154,862 A * | 11/2000 | Tabata ............. | G01R 31/31935 714/42 |
| 6,449,743 B1 | 9/2002 | Hosokawa | |
| 7,051,253 B2 | 5/2006 | Rooney et al. | |
| 7,333,962 B2 | 2/2008 | Zen | |
| 7,676,775 B2 | 3/2010 | Chen et al. | |
| 7,987,442 B2 * | 7/2011 | Rajski .................... | G01R 31/01 714/737 |
| 8,180,142 B2 | 5/2012 | Eckert et al. | |
| 8,239,032 B2 | 8/2012 | Dewhurst | |

(Continued)

FOREIGN PATENT DOCUMENTS

| DE | 102006017546 A1 | 10/2007 |
|---|---|---|
| DE | 10337284 B4 | 3/2014 |

(Continued)

OTHER PUBLICATIONS

De Carvalho, M.; "Innovative Techniques for Testing and Diagnosing SoCs"; Politecnico Di Torino; Doctorate School; Ph.D. In Computer and Control Engineering—XXVI Cycle; PHD Thesis; Feb. 2015; pp. 160.

(Continued)

*Primary Examiner* — Steve Nguyen
(74) *Attorney, Agent, or Firm* — Brian M. Restauro

(57) ABSTRACT

Embodiments of the present invention provide methods, program products, and systems for testing a memory cell arrangement. Embodiments of the present invention can determine categories of memory fail conditions by checking memory cells of with a sequence of test parameter configurations for a malfunction using test parameters, storing for test parameter configurations for which a malfunction is detected, and assigning the respective test parameter configuration with a bit fail count comprising the number of malfunctioning memory cells. Embodiments of the present invention can be used to create a relational data structure representing test parameter configurations and can combine one or more test parameter configurations and can create a representation of the bit fail counts of the respective test parameter configurations.

20 Claims, 14 Drawing Sheets

(56) References Cited

U.S. PATENT DOCUMENTS

| | | | |
|---|---|---|---|
| 8,301,414 B2 * | 10/2012 | Cheng | G06F 11/267 702/185 |
| 8,368,768 B2 | 2/2013 | Asajima et al. | |
| 8,707,232 B2 * | 4/2014 | Tang | G06F 17/5022 702/118 |
| 8,854,073 B2 | 10/2014 | Grosch et al. | |
| 8,873,318 B2 | 10/2014 | Shvydun et al. | |
| 2002/0184587 A1 | 12/2002 | Boateng | |
| 2003/0140287 A1 | 7/2003 | Wu et al. | |
| 2003/0217315 A1 * | 11/2003 | Maamari | G01R 31/3177 714/741 |
| 2005/0154550 A1 * | 7/2005 | Singh | G01R 31/3183 702/108 |
| 2006/0227634 A1 | 10/2006 | Loh et al. | |
| 2007/0038911 A1 * | 2/2007 | Koenemann | G01R 31/31703 714/732 |
| 2007/0226555 A1 | 9/2007 | Raines | |
| 2007/0283202 A1 | 12/2007 | Cheng et al. | |
| 2010/0135570 A1 | 6/2010 | Eckert et al. | |
| 2013/0004024 A1 | 1/2013 | Challa | |
| 2015/0162099 A1 | 6/2015 | Jeong et al. | |

FOREIGN PATENT DOCUMENTS

| | | | |
|---|---|---|---|
| EP | 1236051 B1 | 3/2004 | |
| GB | 2508761 B | 5/2013 | |
| JP | 2014092950 A | 5/2014 | |
| KR | 101254647 B1 * | 4/2013 | G11C 29/10 |
| WO | 2012066819 A1 | 5/2012 | |
| WO | 2014047225 A1 | 3/2014 | |

OTHER PUBLICATIONS

Kim, J. et al.; "Multi-bit Error Tolerant Caches Using Two-Dimensional Error Coding"; Appears in Proceeding of the 40th Annual ACM/IEEE International Symposium on Microarchitecture (MICRO-40); pp. 13.

Schlemminger, N.; Grace Period Disclosure; "Practice report for the second semester"; Evaluation of Bluemix for the hardware test department. Especially for heavy calculation in the cloud.; IBM Corporation; pp. 12; Aug. 31, 2015.

* cited by examiner

| vdd \ vcs | 0.60 | 0.70 | 0.88 | 0.90 | 0.96 | 1.04 | 1.20 |
|---|---|---|---|---|---|---|---|
| 0.60 | A | | | | | | |
| 0.70 | | B | | | | | |
| 0.80 | | | C | | | | |
| 0.90 | | | | D | | | |
| 1.00 | | | | | E | | |
| 1.10 | | | | | | F | |
| 1.20 | | | | | | | G |

| | |
|---|---|
| A: 1710610 | E: 1606512 |
| B: 1710392 | F: 1599155 |
| C: 1619308 | G: 1583147 |
| D: 1617487 | |

FIG. 8

DETERMINING CATEGORIES FOR MEMORY FAIL CONDITIONS

STATEMENT REGARDING PRIOR DISCLOSURES BY THE INVENTOR OR A JOINT INVENTOR

The following disclosure(s) are submitted under 35 U.S.C. §102(b)(1)(A): DISCLOSURE(S):

(1) Nils Schlemminger, Practice Report For The Second Semester, Evaluation of Bluemix® for the hardware test department, especially for heavy calculation in the cloud, Aug. 31, 2015

BACKGROUND

The present invention relates generally to the field of memory cell arrangement, and more particularly to testing a memory cell arrangement.

Typically, designers of modern memory cell arrangements (e.g., in Central Processing Unit (CPU) caches, main memories, etc.) aim to ensure that memory arrangement meets high performance criteria. One way to ensure that memory arrangements meet the high performance criteria is to identify malfunctions and provide accurate corrective actions. In some instances, malfunctions can be caused by a plurality of test conditions.

SUMMARY

Embodiments of the present invention provide methods, computer program products, and systems for testing a memory cell arrangement. In one embodiment of the present invention, a method is provided comprising: checking memory cells of a memory cell arrangement with a sequence of test parameter configurations for a malfunction using test parameters from different parameter categories; storing test parameter configurations for which a malfunction is detected; assigning each of the stored test parameter configurations with a bit fail count comprising a number of malfunctioning memory cells; defining an order for the stored test parameter configurations; creating a relational data structure comprising a plurality of interlinked nodes and a root node such that each test parameter configuration of the test parameter configurations is represented by a path, wherein the test parameters associated with the respective test parameter configurations are assigned to one or more nodes of the plurality of interlinked nodes of the path according to the defined order starting from the root node with the bit fail count detected for the respective test parameter configuration being assigned to the respective path; combining one or more segments of the relational data structure according to a predefined rule for obtaining one or more test groups; and creating a representation of the bit fail counts of the respective test groups.

BRIEF DESCRIPTION OF THE DRAWINGS

In the following, embodiments of the invention are explained in greater detail, by way of example only, making reference to the drawings in which:

FIG. 8 depicts a schematic diagram illustrating an exemplary three dimensional diagram representing bit fail counts, in accordance with an embodiment of the present invention.

DETAILED DESCRIPTION

Figure 1A:
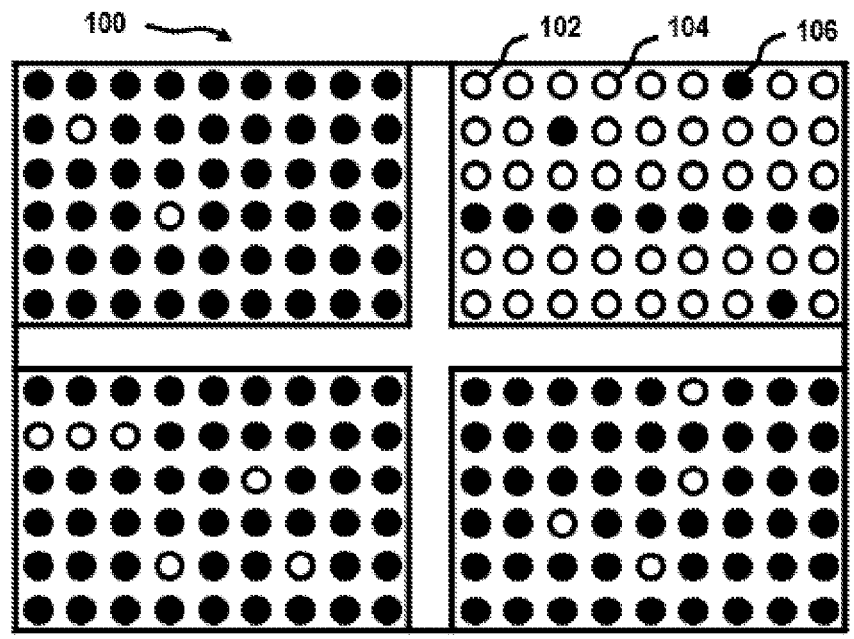
FIGS. 1A and 1B depict first schematic diagrams illustrating an exemplary memory cell arrangement with bit fails caused by two different exemplary test parameter configurations, in accordance with an embodiment of the present invention.

Embodiments of the present invention recognize that in testing memory cell arrangements, a malfunction revealing a problem can be caused by a plurality of test conditions. In some instances, these test conditions interfere with each other making it difficult to isolate the true cause of a malfunction. Thus, in those instances, it may be difficult to define accurate corrective actions. Embodiments of the present invention provide solutions for identifying causes of malfunctions during test conditions. In this manner, as discussed in greater detail later in this specification, embodiments of the present invention can determine categories of memory fail conditions (i.e., automated memory cell fail conditions category identification) to aid in memory cell arrangement testing, prescribe appropriate correct action for the identified fail conditions, and ensure performance of memory cells.

The present invention may also include the following example features:

A "memory cell arrangement", as used herein, refers to an integrated circuit comprising a plurality of memory cells. A memory cell may be any kind of electronic memory cell such as a semiconductor memory like, for example, a time random access memory (RAM) or non-volatile read only memory (ROM), in particular, but without restriction, a SRAM, eDRAM, EPROM. Herein, a "cell" is also referred to as a "bit".

A "tree data structure", as used herein, may refer to a data structure with a plurality of interlinked nodes, wherein any two nodes are connected by exactly one tree path. The tree structure may have a root node from which all tree paths start. The root node resembles hierarchy level 0. All nodes connected to the root node via one direct link are nodes of hierarchy level 1. All nodes which are connected with the root node via two links are nodes of hierarchy level 2, and so on. According to other embodiments of the present invention, all nodes except the root node may be assigned with a test parameter. Nodes can be grouped and assigned a parameter combination. Links leading to the nodes can be assigned with bit fail counts. or, after grouping, with a test parameter combination, while the links leading to the nodes may be assigned with bit fail counts. A tree data structure may be provided by any known data format as long as the logical structure of the respective data keeps the above identified characteristic of a tree structure.

Embodiments of the present invention may provide a method for determining categories of memory fail conditions, that is, automated memory cell fail conditions category identification. Thereby, characteristics of conditions causing a malfunction may be identified, that is, memory fails may be registered and analyzed based on their behavior (as opposed to, for example, based on their position or failure type).

For this purpose, test condition variables are combined in all possible combinations, determining the number of fails for each of these combinations. Further, a representation (e.g., in form of a bar chart) may be generated grouping bars (which denote test parameter categories) according to predefined grouping criteria and assigning to each group the respective bit fail count value (i.e., the sum of bit fail counts of all bars put together into the respective group).

Chip memory testing using bit fail maps (BFM) is an important step in memory characterization during a development phase of a new memory cell arrangement like a static RAM (SRAM) array. In the case of SRAM arrays with a certain number of hard defects, the characterization becomes more and more difficult the more test parameters are taken into account. Thus, an evaluation method may be provided by embodiments to deal with such a level of complexity.

Chip memory testing may be performed on detailed dimensional matrix maps which result in large amounts of memory requirements during data evaluation. Depending on the use case, additional meta-information may be hosted in the BFM-like layout information. It is a further objective to identify failure mechanisms which may be layout dependent. Thereby, one of the pressing questions is how to determine the SRAM cells' behavior with respect to different test parameter conditions applied during tests in order to identify correlations between the test parameter conditions and the fails.

One of the primary problems of chip memory tests is the large amount of resulting test data. Due to multiple and/or nonlinear correlations, it may be challenging to extract, for example, an SRAM cell behavior as a function of the test conditions and test pattern applied. Embodiments of the present invention may provide an efficient method for indicating interesting test parameter configurations in the test result datasets.

Embodiments of the present invention may have the advantage of providing a formal way to characterize the memory failure(s) in a descriptive way condition wise (i.e., depending on the test parameter conditions applied). This may be advantageous over previous solutions which may either rely on layout dependent fail categories or fail borders, since embodiments of the present invention may identify correlations between the layout and external influences given by the test parameters.

Due to the sub-tree creation and data optimization, embodiments of the present invention may provide for full failure analysis results without extensive memory consumption. Thus, all possible test configurations and results may be allowed being kept in main memory in parallel.

By allowing keeping complete BFMs, embodiments of the present invention may avoid difficulties when evaluating the acquired data due to content missing in the dump.

For the test parameter condition-based analysis, initially all bits may be overlaid. In order to test a SRAM behavior, all memory cells may be tested at various conditions. The result may be a fail count for each test condition reflecting the number of fails occurred during the respective test condition. The fail count may represent the number of SRAM cells failed in the respective test run. In case of a fail the dedicated layout information may additionally be stored for further analysis. The BFM may be used as an input for the generation and evaluation of a tree data structure.

An example of a bit fail map log-file may look as follows: Example Bit Fail Map Log File 1

```
>>>>>> START mfg 0.700Vdd 1000MHz >>>>>>>
            totalFC PinOut: 30
<<<<<< STOP mfg 0.700Vdd 1000MHz <<<<<<<
>>>>>> START test 0.700Vdd 1000MHz >>>>>>>
            totalFC PinOut: 60
<<<<<< STOP test 0.700Vdd 1000MHz <<<<<<<
>>>>>> START mfg 0.700Vdd 2000MHz >>>>>>>
            totalFC PinOut: 35
<<<<<< STOP mfg 0.700Vdd 2000MHz <<<<<<<
>>>>>> START test 0.700Vdd 2000MHz >>>>>>>
            totalFC PinOut: 70
<<<<<< STOP test 0.700Vdd 2000MHz <<<<<<<
```

This is an example test result file comprising the BFM with the layout information suppressed. The BFM comprises a plurality of data sets. Each data set of the test result file may have a start and an end indicator. The start and end indicators may be start and stop lines. In start lines the following elements may be extracted: (a) a test voltage "Vdd" of 0.700V; (b) two test frequencies of 1000 MHz and 2000 MHz; and (c) two test pattern "mfg" and "test". The fail count may be listed in the next line comprising the keyword "totalFC", an output pin "PinOut" and a number.

According to embodiments of the present invention, each memory cell of the memory cell arrangement is checked with a sequence of test parameter configurations for a malfunction using test parameters from different parameter categories. According to embodiments of the present invention, a fraction of the total number of memory cells of the memory cell arrangement is checked with a sequence of test parameter configurations for a malfunction using test parameters from different parameter categories.

According to embodiments of the present invention, for each test parameter configuration for which a malfunction is detected, the respective test parameter configuration is stored and the respective test parameter configuration is assigned with a bit fail count (BFC) comprising the number of malfunctioning memory cells. According to embodiments of the present invention, for test parameter configurations for which a malfunction is detected, the respective test parameter configuration is stored and the respective test parameter configuration is assigned a bit fail count comprising the number of malfunctioning memory cells, in instances where a predefined criterion is satisfied. A respective predefined criterion may, for example, be given by a minimum bit fail count threshold which has to be reached or exceeded. Otherwise, the respective bit fail count may be neglected.

According to embodiments of the present invention, the creation of the hierarchical tree data structure further comprises for each test parameter configuration: (i) generating a set of test parameter sub-combinations comprising all sub-combinations of the test parameters of the respective configuration in accordance the predefined order, in each sub-combination one or more of the test parameters of the respective configuration being neglected; (ii) assigning to each test parameter sub-combination the bit fail count of the respective test parameter configuration; and (iii) extending the hierarchical tree data structure such that each test parameter sub-combination is represented by a tree path with the test parameters of the respective sub-combination being assigned to the nodes of the tree path according to the defined order starting from the root node and with the bit fail count of the respective sub-combination assigned to the respective tree path.

Neglecting in each sub-combination one or more of the test parameters of the respective configuration refers to the fact that each sub-combination of test parameters takes into account less test parameters than the respective configuration. For example, a test parameter configuration may comprise the test parameters a, b, and c. Thus, the sub-combinations may only take into account combinations of the test parameters a, b, and c comprising less than 3 test parameters (e.g., one or two test parameters).

Generating sub-combinations of the test parameters of the respective configuration in accordance with the predefined order refers to the fact that only those sub-combinations with test parameters less than the respective test parameter configuration are taken into account which obey the predefined order. The predefined order in case of the example above may be, for example, a, b, c. Thus, only the sub-combinations "ab", "bc", "ac", "a", "b", and "c" may be taken into account. Combinations like "ba" are not taken into account for not being in accordance with the predefined order.

This may have the beneficial effect that the influence of all possible test parameter combinations may be taken into account and analyzed. Thereby, more insight in the possible dependences of a memory cell arrangement on different combinations of test parameters may be gained compared to an analysis considering only the measured combinations of test parameters.

According to embodiments of the present invention, the creation of the hierarchical tree data structure further comprises: (i) for each tree path to be generated checking whether the tree data structure already comprises a tree path assigned with an identical starting combination of test parameters; and (ii) in case no tree path assigned with an identical starting combination of test parameters is detected, generating the respective tree path starting at root node independently of existing tree paths and assigning the bit fail count of the respective tree path to each link comprised by the respective tree path.

This may have the beneficial effect that the tree data structure may efficiently be expended by new tree paths. This may further have the beneficial effect that each node is assigned with a bit fail count of the link leading directly to the respective node. Due to the tree-like structure only one link is assigned to each node leading directly to the same.

According to embodiments of the present invention, the creation of the hierarchical tree data structure further comprises: upon detecting one or more tree paths assigned with an identical starting combination of test parameters, merging the respective tree path to be generated with one of the detected tree paths.

This may have the beneficial effect that the amount of data may be kept limited by avoiding superfluous paths and, due to the simplified structure of the generated tree data structure, the data evaluation may become more efficient.

According to embodiments of the present invention, the creation of the hierarchical tree data structure further comprises: merging the respective tree path to be generated with the detected tree path comprising the largest identical starting combination of test parameters.

This may have the beneficial effect that the amount of data may be kept limited by merging largest possible tree path segments and, due to the simplified structure of the generated tree data structure, the data evaluation may become more efficient.

According to embodiments of the present invention, the creation of the hierarchical tree data structure further comprises: (i) checking whether the complete test parameter combination of the detected tree path comprising the largest identical starting combination of test parameters is identical to the complete test parameter combination of the respective tree path to be generated; and (ii) upon detecting a respective complete identity, merging the respective tree path to be generated with the respective detected tree path by adding the bit fail count of the respective tree path to be generated to each link of the respective detected tree path.

This means that the test parameter combination of the tree path to be generated may already be comprised by the tree data structure. Thus, when taking into account such tree paths to be generated (which originate from a measurement not yet taken into account), only information regarding the bit fail count needs to be updated. This may have the beneficial effect that the amount of data may be kept limited and, due to the simplified structure of the generated tree data structure, the data evaluation may become more efficient.

According to embodiments of the present invention, the creation of the hierarchical tree data structure further comprises: (i) checking whether the complete test parameter combination of the respective tree path to be generated is identical to the starting test parameter combination of the detected tree path comprising the largest identical starting combination without being identical to the complete test parameter combination of to the respective detected tree path; and (ii) upon detecting a respective partial identity, neglecting the respective tree path to be generated.

This means that the information comprised by the tree path to be generated is already fully comprised by the existing path structure of the tree data structure. Thus, in order to keep the amount of data to be stored limited, the respective tree path to be generated may be neglected rather than being generated.

According to embodiments of the present invention, the creation of the hierarchical tree data structure further comprises: (i) checking whether the detected tree path comprising the largest identical starting combination of test parameters comprises all test parameters of the respective tree path to be generated without being identical to the test parameter combination of the respective tree path to be generated and without the respective starting combination being identical to the test parameter combination of the respective tree path to be generated; and (ii) upon detecting a respective identity, merging the respective tree path to be generated with the respective detected tree path by adding to the detected tree path at the last node of the respective starting combination a tree branch comprising nodes assigned with the test parameters not comprised by the respective starting combination such that the tree path from the root node to the end of the respective tree branch comprises all test parameters of the respective tree path to be generated.

This means that the information regarding the bit fail count of the test parameter combination of the tree path to be generated is already comprised by the tree data structure. Thus, only the information regarding the reduced representation of the test parameter combination not yet taken into account by the tree data structure needs to be update by adding a new branch. This may have the beneficial effect that the amount of data may be kept limited and, due to the simplified structure of the generated tree data structure, the data evaluation may become more efficient.

According to embodiments of the present invention, the creation of the hierarchical tree data structure further comprises: (i) checking whether the detected tree path comprising the largest identical starting combination of test parameters is not comprising all test parameters of the respective tree path to be generated; and (ii) upon detecting that the respective detected tree path does not comprise all test parameters of the respective tree path to be generated, merging the respective tree path to be generated with the respective detected tree path by adding to the detected tree path at the last node of the respective starting combination a tree branch comprising nodes assigned with the test parameters not comprised by the respective starting combination such that the tree path from the root node to the end of the respective tree branch comprises all test parameters of the respective tree path to be generated and adding the bit fail count of the respective tree path to be generated to each link of the respective branch and the respective starting combination.

This may have the beneficial effect that the full information content comprised by the tree path to be generated is taken into account, while superfluous tree segments are avoided keeping the amount of data to be stored limited.

According to embodiments of the present invention, the combining of tree segments for obtaining test groups further comprises: selecting tree segments to be combined by using differences of bit fail counts assigned to the tree segments as a selection criterion.

A "difference of bit fail counts", as used herein, refers to a mathematical quantity indicating which one of two given bit fail counts is larger or whether they are equal. The difference may, for example, be the actual difference between the bit fail counts themselves. Alternatively, the difference may be the difference between functions of the bit fail counts, such as their normalized values or their squares. The difference may also be given by a gradient between two fail bit counts, when the fail bit counts are sorted, that is, functions of a sorting criterion, (e.g., the value of a frequency for which the respective fail bit counts have been detected).

Thus, embodiments of the present invention can filter out fails which occur independently of the variation of the respective test parameter configurations (e.g., bit fails due to memory cells with hard fails). Thus, the information provided may primarily take into account the soft errors (i.e., errors that depend on the variation of the respective test parameter configurations).

According to embodiments of the present invention, the combining of tree segments for obtaining test groups further comprises: performing the combining upon receiving a request for generating test groups according to a pre-defined rule, the request comprising a test parameter category for which the groups are to be generated.

According to embodiments of the present invention, the combining of tree segments for obtaining test groups further comprises: performing the combining automatically for all tree segments of the data tree according to a pre-defined rule for obtaining test groups, (i.e., systematic test group building) for all test parameter categories (i.e., nodes of the tree data structure).

According to embodiments of the present invention, the predefined rule comprises for a first parameter category: (i) selecting a first set of nodes comprising all nodes of the first hierarchy level of the tree data structure assigned with a first test parameter from the first parameter category; (ii) sorting the first test parameters assigned to the nodes of the first set; (iii) for each pair of adjacent test parameters of the sorted first test parameters, determining the difference of the two bit fail counts assigned to the links leading directly to the nodes assigned with the respective adjacent test parameters; and (iv) combining the nodes of the first set into test groups such that the differences calculated for the nodes of each test group are all positive or all negative and within a predefined range.

This may have the beneficial effect that additional information is provided regarding test groups of test parameters. Using those test groups for the further analysis, the amount of data to be taken into account may be further reduced, allowing a better handling of the data.

According to embodiments of the present invention, the combining of the nodes of the first set further comprises: (i) for each test group obtained generating an additional tree segment by copying all tree segments starting with a link leading directly to one of the nodes of the first set of nodes; (ii) merging the first links and nodes of the copied tree segments; (iii) adding up the bit fail counts assigned to merged links; and (iv) assigning the merged nodes with a test group ID of the respective test group.

This may have the beneficial effect that the respective grouped tree segments may be integrated in the tree data structure and efficiently be used for the further analysis without a need for creating an additional file for the respective grouped tree segments.

According to embodiments of the present invention, the representation further comprises all the bit fail counts assigned to the links leading directly to the nodes of the first set of nodes.

Embodiments of the present invention provide the additional benefit of being able to present the effect of other test parameter combinations resembled by the respective nodes and the bit fail counts assigned thereto, in addition to the effect of the test groups. For example, individual test parameter combinations may cause significant or above-average bit fail counts. Thus, it may be beneficial to analyze these test parameter combinations on their own without grouping them with other test parameter combinations which could otherwise dilute the significance of the respective individual test parameter combinations.

According to embodiments of the present invention, the representation is a bar diagram with the heights of the individual bars representing bit fail counts.

This may have the beneficial effect that the bars allow for an efficient and effective presentation of the information encoded in the tree data structure.

According to embodiments of the present invention, the method further comprises: calculating the bit fail counts of each test groups by summing up the bit fail counts of the tree segments combined into the respective test group.

According to embodiments of the present invention, the method further comprises: (i) selecting two parameter categories; (ii) selecting a set of sorted pairs of test parameters of both categories; (iii) selecting the nodes assigned with the respective test parameters; and (iv) using bit fail count differences between nodes of adjacent test parameter pairs for determining test groups.

According to embodiments of the present invention, the bit fail counts of all pairs of test parameters are represented by a three dimensional bar diagram e.g. with the heights of the individual bars representing bit fail counts.

According to embodiments of the present invention, the method further comprises: extending the grouping with respect to a second parameter category: (i) selecting a second set of nodes comprising all nodes of the next level of hierarchy of the additional tree segment following the merged nodes which are assigned with a second test parameter from the second parameter category; (ii) sorting the second test parameters assigned to the nodes of the second set; (iii) for each pair of adjacent test parameters of the sorted second test parameters determining the difference of the two bit fail counts assigned to the links leading directly to the nodes assigned with the respective adjacent test parameters; and (iv) combining the nodes of the second set into test groups such that the differences calculated for the nodes of each test group are all positive or all negative and within a predefined range.

This may have the beneficial effect that the whole tree data structure may successively be searched for tree segments to be combined for obtaining test groups. Furthermore, the more hierarchy levels are grouped (i.e., the more test parameter combinations are taken into account for grouping), the more data may be combined providing simpler tree data structures and thus facilitating the evaluation of the respective data structures.

According to embodiments of the present invention, the combining of the nodes of the second set further comprises: (i) for each test group obtained generating an additional tree segment by copying the tree segments starting with a link leading directly to one of the nodes of the second set of nodes; (ii) merging the first links and nodes of the copied tree segments; (iii) adding up the bit fail counts assigned to merged links; and (iv) assigning the merged nodes with a test group ID of the respective test group.

This may have the beneficial effect that the respective grouped tree segments may be integrated in the tree data structure and efficiently used for the further analysis without a need for creating an additional file for the respective grouped tree segments.

According to embodiments of the present invention, the method further comprises: applying a filter to the hierarchical tree data structure including the test groups in order to identify test parameter configurations categories to be further analyzed.

This may have the beneficial effect that that irrelevant or not important data may be neglected for further analysis and/or canceled from the tree data structure. Embodiments of the present invention can identify test parameter combinations crucial for bit fail counts and based on this identification, a solution for avoiding bit fail counts may be determined (e.g., a new layout for a memory cell arrangement). Other solutions can include using a different transistor dimension for certain involved circuits, choosing a different circuit implementation which is less sensitive to certain processing effects during manufacturing, using improved/other manufacturing techniques, placing spare cells at boarders and/or edges of the memory cell arrangement leading to structure density changes (spare cells may get a process hit and be scarified), etc.

According to embodiments of the present invention, a new dimensioning of the memory cell arrangement, an amendment of the manufacturing conditions or a modification of memory cell arrangement, (e.g., by adding additional memory cells), may thus be determined and implemented as a solution of the identified problem. For example, in instances where unexpected bit fails occur at the boundaries of the bit cell arrangement, embodiments of the present invention can identify the problem as an inefficient exposure to light (e.g., exposure to light of the respective memory cells during a photolithographic manufacturing procedure). Embodiments of the present invention can suggest solutions to the identified problem. For example, embodiments of the present invention can suggest to amend the respective photolithographic manufacturing procedure by using other filters. Other suggestions can include adding one or more rows of memory cells at the boarders of the memory cell arrangement. These additional memory cells may not be used for storing data, but for shielding the other memory cells such that all memory cells of the original memory cell arrangement shielded by the additional memory cells may exhibit an appropriate behavior without unexpected fails.

According to embodiments of the present invention, the filter may be given by a predefined number of nodes and/or groups assigned with the largest bit fail counts. According to embodiments of the present invention, the filter comprises a predefined pattern of differences of bit fail counts assigned to nodes and/or groups for selecting unexpected behavior of the memory cell arrangement.

According to embodiments, the method further comprises: (i) storing for each test parameter configurations for which a malfunction is detected a bit fail map comprising information about a spatial distribution pattern of the malfunctioning memory cells; and (ii) determining a spatial distribution pattern of memory cells to be further analyzed using the parameter configuration categories to be further analyzed and the bit fail map.

This may have the beneficial effect that the determined memory fail conditions categories (i.e., the test parameter configurations crucial for the occurrence of bit fails), may be correlated to certain spatial distribution pattern of memory cells. Based on that information, embodiments of the present invention can determine alternative spatial distribution pattern of in order to avoid the respective bit fails.

Figure 1B:
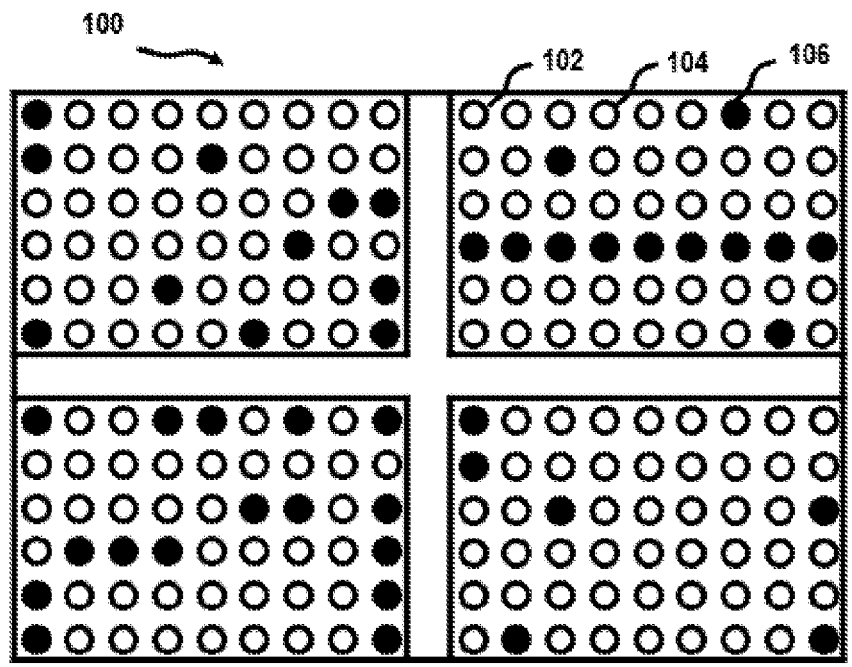

FIGS. 1A and 1B depict schematic diagrams illustrating bit fail distributions of an exemplary memory cell arrangement 100, in accordance with an embodiment of the present invention. Each of the two bit fail distributions is caused by different test parameter configurations, that is, different boundary conditions under which the respective memory cell arrangement is tested. The memory cell arrangement 100 comprises a plurality of memory cells 102 arranged according to a specific design layout. Each of the memory cells 102 may for example be a static random-access memory (SRAM) or a dynamic random-access memory (DRAM), for example, an embedded DRAM (eDRAM). The massive circles 106 indicate memory cells 102 for which a malfunction has been detected when testing the memory cell arrangement 100 with specific test parameter configuration. The perforated circles 104 indicate memory cells 102 for which no malfunction has been detected (i.e., which exhibit a reliable behavior as expected). Comparing the different bit fail contributions of FIGS. 1A and 1B, it becomes apparent that depending on the test parameter configuration chosen for testing the memory cell arrangement significant differences between the resulting bit fail distribution may occur.

Since there is a large variety of test parameters which may be varied, large amounts of data are produced when testing memory cell arrangement 100. It becomes difficult to identify which test parameters of all those test parameter configurations are responsible for causing problematic malfunctions which have to be resolved having a large amount of data comprising multiple dependencies between the different test parameters which may even be non-linear.

Embodiments of the present invention may provide a method for efficiently and effectively determining test parameters of the test parameter configurations for which the memory cell arrangement 100 exhibits a problematic malfunction characteristic. For the determined test parameter configurations, the layout of the memory cell arrangement may be analyzed in further detail in order to identify the cause for the malfunction under the respective test parameter configurations. Thus, the layout of the memory cell arrangement 100 may, for example, be modified in order to prevent the occurrence of the respective malfunction. For example, modifications can include modifying transistor dimensions, amending manufacturing conditions, or modifying the memory cell arrangement (e.g., by adding additional memory cells).

The memory cells 102 of the memory cell arrangement 100 may, for example, be semiconductor memories (e.g., time random access memories (RAMs) or non-volatile read only memories (ROMs)), where RAMs may, for example, either be static (SRAM) or dynamic (DRAM). An SRAM uses bistable latching circuitry (i.e., a flip-flop) to store each bit. Although an SRAM may exhibit data remanence, it is still referred to as a volatile type of memory since all data is eventually lost, when the memory is not powered. A DRAM contrary to an SRAM has to be periodically refreshed in order to maintain the stored data. SRAMs may generally be used for CPU cache, while DRAMs may be used for computers' main memories. An SRAM memory cell arrangement may generally be arranged as a matrix of memory cells fabricated in an integrated circuit chip, wherein address decoding in the chip allows accessing each one of the cells for read/write functions. SRAM memory cells are often arranged in rows such that blocks of data such as words or bites can be written or read simultaneously. SRAM memory cells of different types are known. A basic CMOS SRAM cell may, in general, include two n-type (NMOS) pull down or drive transistors and two p-type (PMOS) low transistors in a cross-couple inverter configuration, with two additional NMOS select transistors added to build a six transistor cell (6T cell). Other known types of SRAM chips may use 4, 8, 10 (4T, 8T, 10T SRAM) or even more transistors. Four transistor SRAM cells may, for example, be used in standalone SRAM devices. An SRAM cell may have three general states: standby, wherein the circuit is idle; reading, wherein data may be requested to be read from the respective SRAM cell; and writing, wherein the content of the SRAM cell is updated. A further example for a memory cells may be eDRAM cells, (i.e., capacitor-based dynamic random-access memory cells integrated on the same die) or module as an ASIC or processor.

In order to test the memory cell arrangement 100 for malfunctions, data may be written to each memory cell 102 of the arrangement under a specific test parameter configuration and afterwards read from each of the respective memory cells under the same parameter configuration. When the same data, which has been written before, is read, the respective memory cell functions probably. In instances when same data is not read, the respective memory cell occurs to be malfunctioning under the respective test parameter configuration. The read/write operation may be applied repeatedly or part of the same write or read operation may be applied repeatedly in order to test each of the memory cells in depth.

The test parameters may be parameters of different parameter categories. A parameter category may, for example, comprise the magnitudes of voltage applied to the memory cells, the frequencies of applied voltages, the ambient temperatures, the types of test pattern applied (i.e., the types of order according to which the individual memory cells are tested). Each test parameter configuration comprises a test parameter from one or more of the respective test parameter categories, wherein the test parameter is a specific value chosen from the respective category. Some categories may be neglected. For example, a fixed value may be chosen for the respective category which is not varied when testing the memory cell arrangement. In contrast, a test parameter category may be taken into account by varying a test parameter of the same within a predefined parameter range. For some or all possible test parameter configurations the respective memory cell arrangement may be tested and the bit fail count (i.e., the total number of bits failed under the respective test parameter configuration), may be determined and stored. Furthermore, the respective test parameter configuration may be assigned to the stored value of the bit fail count in order to identify the same. Additionally, structural information about the distribution of the failing bits of the memory cell arrangement may be stored in order to identify structural dependencies regarding the bit fails caused by test parameter configurations for which a requirement to avoid the detected bit fails is determined.

Figure 2:
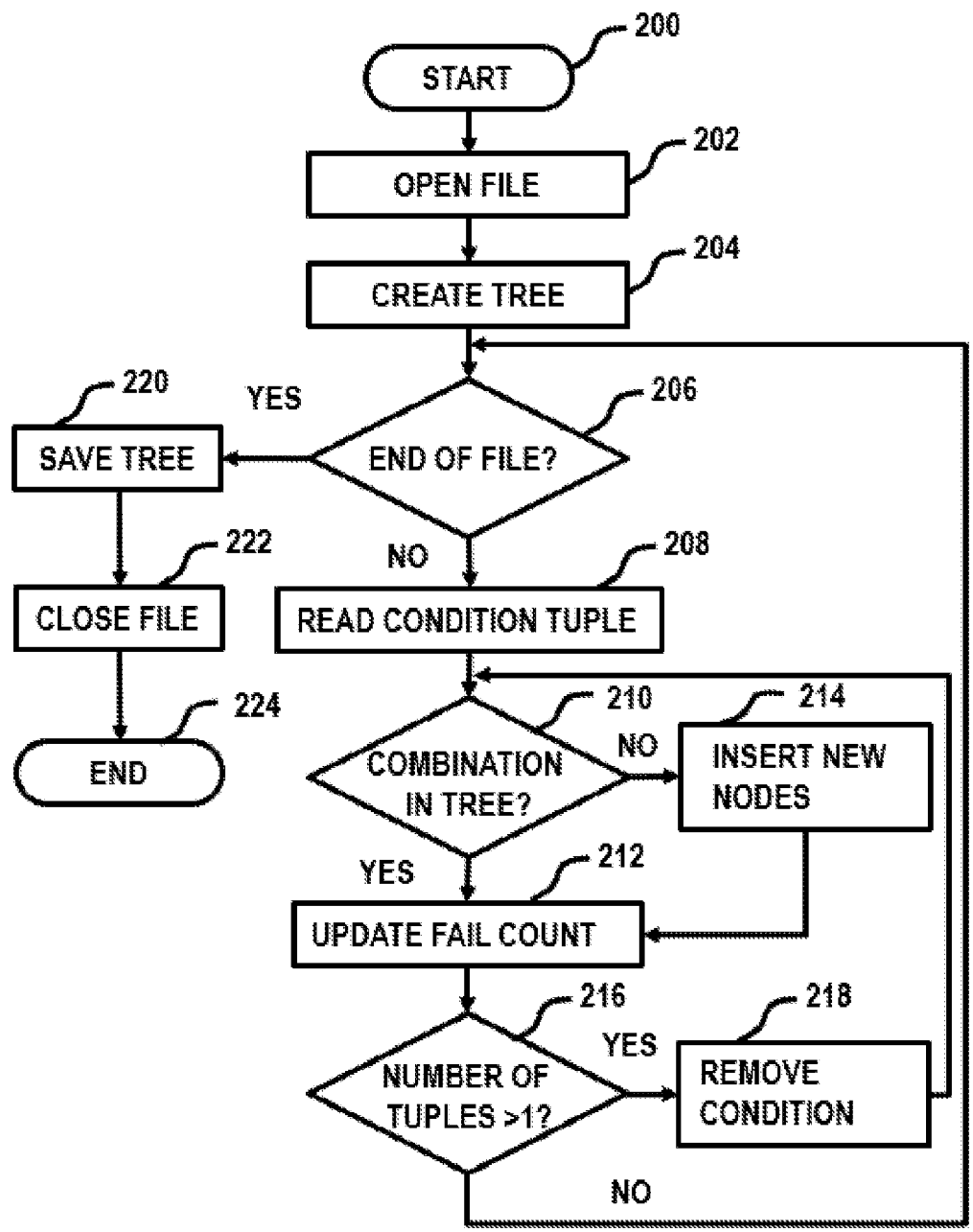
FIG. 2 depicts a schematic block diagram of an exemplary method for generating an optimized tree data structure, in accordance with an embodiment of the present invention.
Figure 3A:
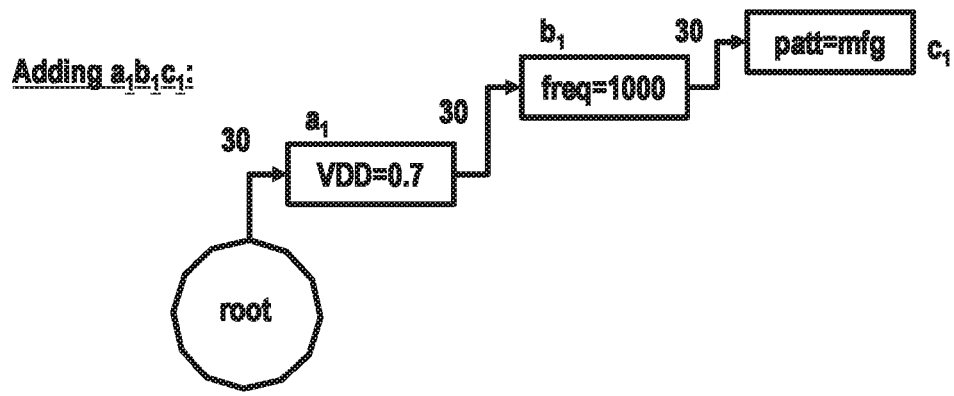
FIG. 3A to 3J depict schematic diagrams illustrating exemplary intermediate steps of the method of FIG. 2, in accordance with an embodiment of the present invention.
Figure 3B:
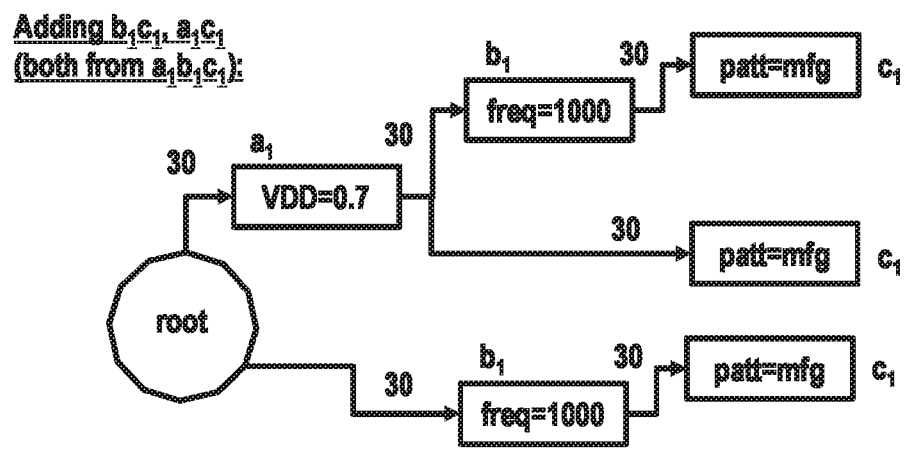
Figure 3C:
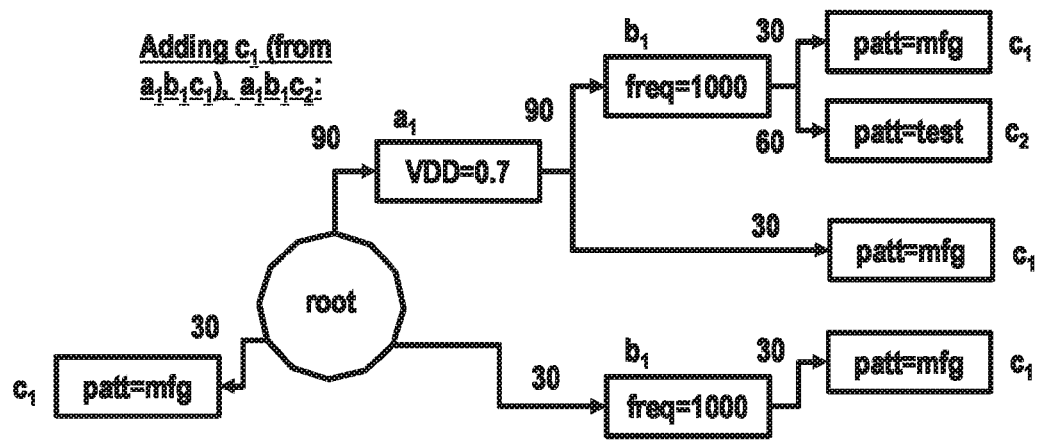
Figure 3D:
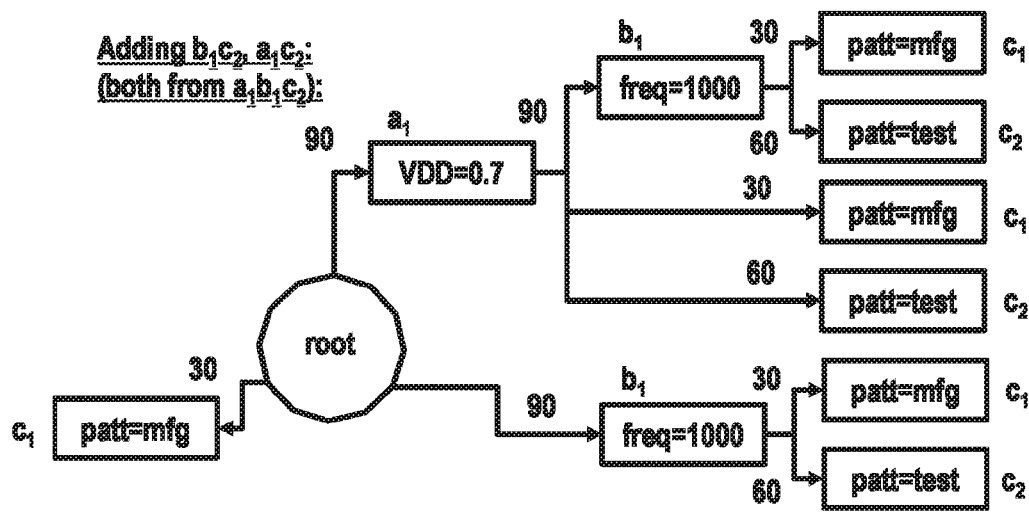
Figure 3E:
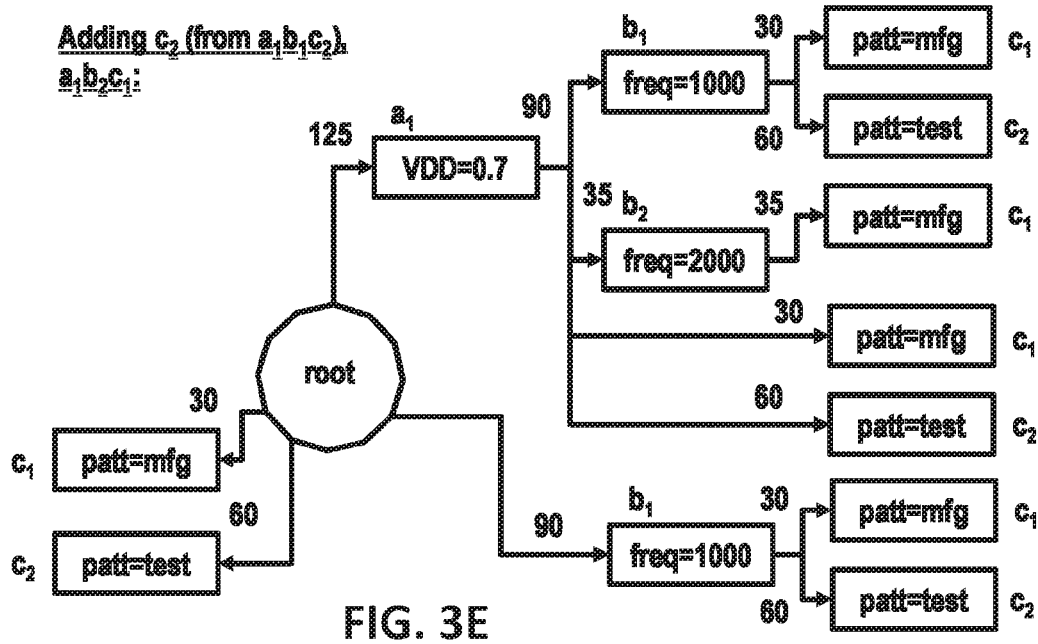
Figure 3F:
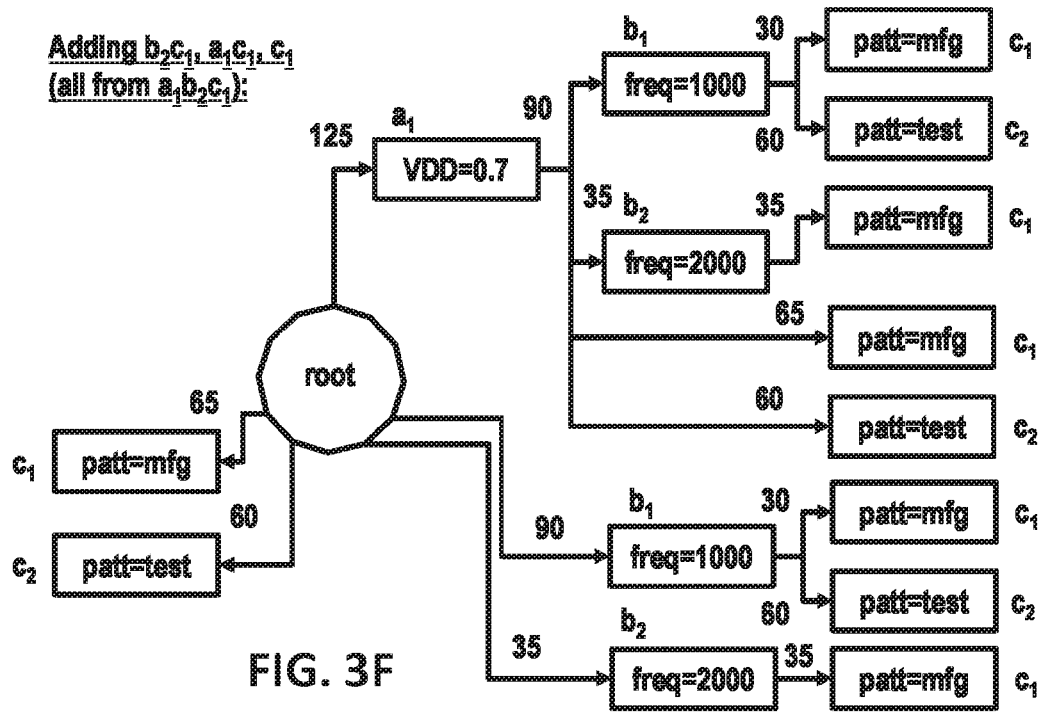
Figure 3G:
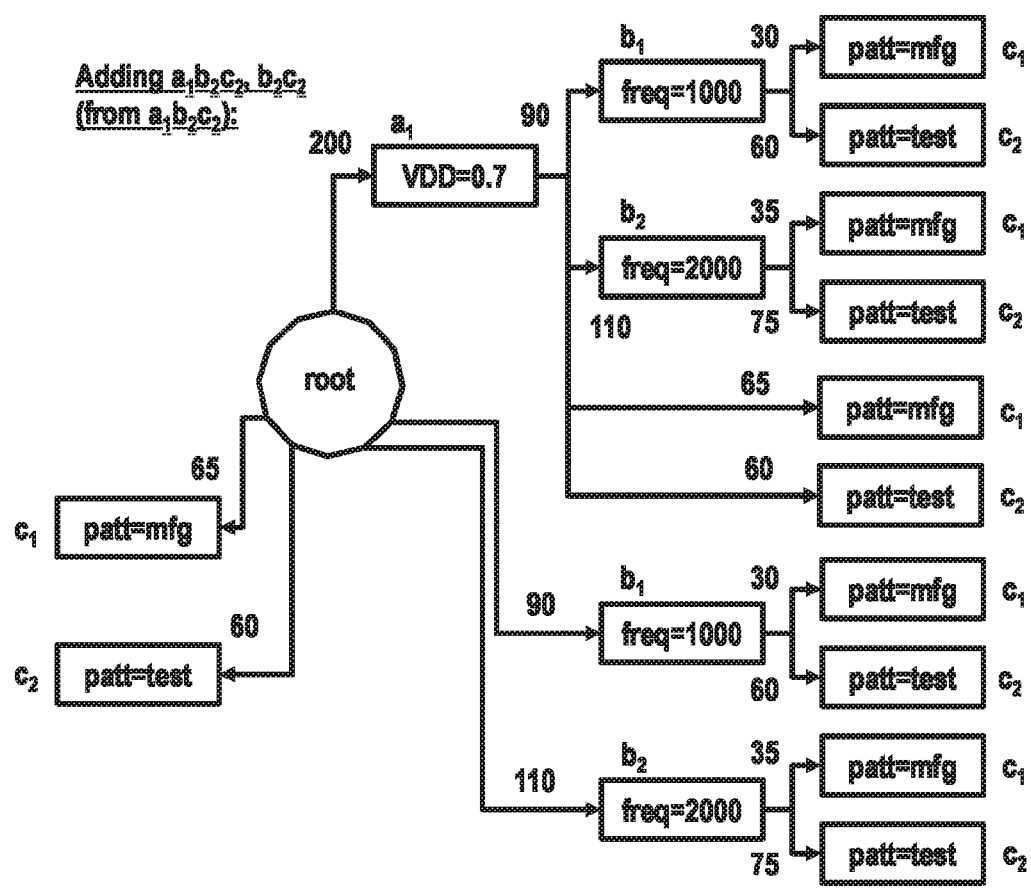
Figure 3H:
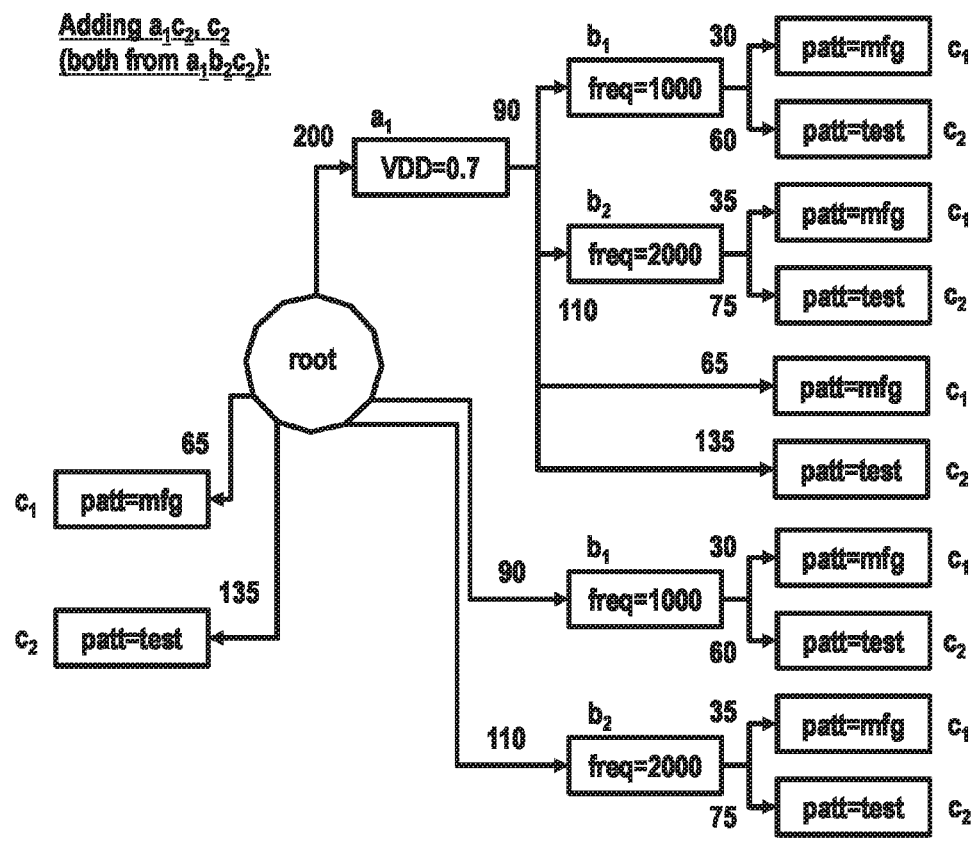

In FIG. 2, a schematic flow diagram illustrating an exemplary method for generating an optimized tree data structure like the one of FIG. 3H is depicted, in accordance with an embodiment of the present invention. The method starts in block 200. The optimized tree data structure may be generated from the test parameter configurations actually measured (e.g., a1b1c1, a1b1c2, a1b2c1, a1b2c2). The respective data may either be directly processed for creating a data tree or may be stored to a file first. In case the data has been stored to a file, the respective file is opened in block 202 and the tree creation is started in block 204. In block 206, the file is checked to determine whether it the end of the file has been reached. As long as the end has not been reached, data parameter configurations (also referred to as a condition tuples) are read from the file in block 208. In block 210, it is checked whether the read test parameter configuration (i.e., the respective combination of test parameters) is already comprised by the tree data structure. In instances where the respective test parameter configuration is not comprised by any of the existing tree paths, additional nodes are added in block 214. In instances where none of the existing tree paths comprises a starting segment which is identical to the starting segment of the new test parameter configuration, a new path is generated by generating new nodes starting at the root node.

In instances where a starting segment is already comprised by an existing tree path, the respective tree path is extended by a new branch with new nodes. In block 212, the fail counts of the tree data structure are updated. In instances where one of the existing data tree paths is identical to the new test parameter configuration, the new parameter configuration is added to the existing test parameter configurations. In this embodiment, the new parameter configuration is added by adding the fail count of the new test parameter configuration to the last link of the existing tree path. All remaining links of the existing tree path are updated accordingly such that each lower level link is assigned with the sum of the fail counts assigned to the higher level links which are connected to the same node as the lower level link. In instances where the new test parameter configuration is identical to a starting segment of an existing tree path, but not to the complete tree path, the fail counts assigned of the respective tree path may not be amended at all.

In block 216, it is checked whether the added test parameter configuration comprises more than one parameter (i.e., whether the respective tuple is larger than one). If this is not the case (i.e., the test parameter configuration only comprises one test parameter), the method continues in block 206, where it is checked whether the end of the file is reached. In instances where the end of the file is reached, the generated tree data structure is saved in block 220 and the file is closed in block 222 such that the method ends in block 224. According to other embodiments of the present invention, the order of block 220 and 222 may be interchanged.

In case it is determined in block 216 that the added test parameter configuration comprises more than one test parameter, all possible sub-combinations of the respective test parameter configuration are successively added to the tree data structure according to the order of the test parameter categories. Accordingly, in block 218 the test parameter configuration is amended by removing one of the test conditions (i.e., one of the test parameters). For each of the sub-combinations the blocks 210 through 216 are applied.

Considering, for example, four test parameter configurations a1b1c1, a1b1c2, a1b2c1, a1b2c2, the following sub-combinations may be allowed for a1b1c1: a1b1, a1c1, b1c1, a1, b1, c1; for a1b1c2: a1b1, a1c2, b1c2, a1, b1, c2; for a1b2c1: a1b2, a1c1, b2c1, a1, b2, c1; and for a1b2c2: a1b2, a1c2, b2c2, a1, b2, c2.

Figure 3I:
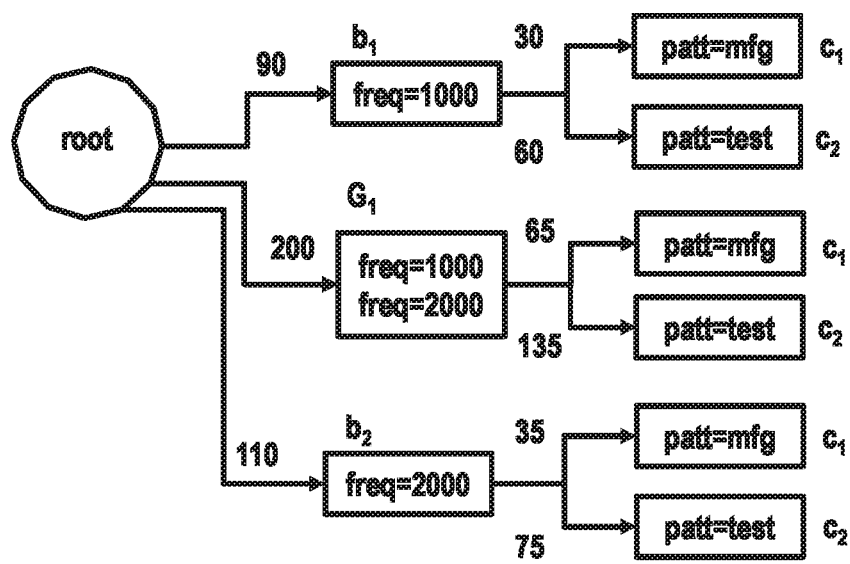
Figure 3J:
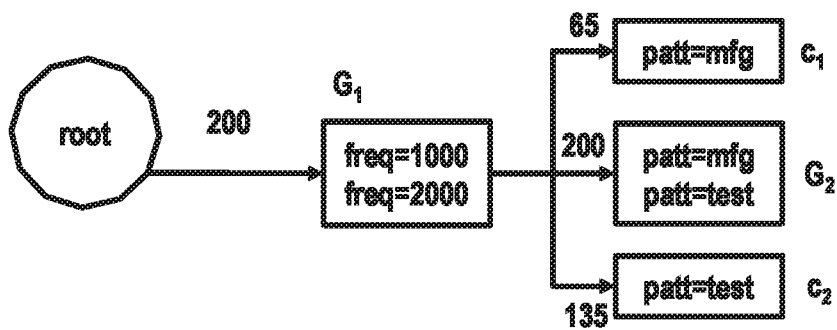

FIG. 3A to 3H depict block diagrams of exemplary intermediate steps of generating an optimized tree data structure as shown in FIG. 3H, in accordance with an embodiment of the present invention. FIG. 3H depicts a schematic block diagram illustrating a hierarchical tree data structure, according to embodiments of the present invention. Thus, FIG. 3A to 3H are an exemplary sequential illustration of the generation of the tree data structure of FIG. 3H representing the time evolution of the tree during the process of tree structure creation. The tree may only be valid at the end of the flow described in FIG. 2. FIGS. 3I and 3J depict block diagrams of tree segments of the tree data structure of FIG. 3H for which a grouping has been performed.

For example three parameter categories a, b, and c may be considered. The first parameter category, parameter category a, comprises one test parameter a1 (e.g. voltage vdd=0.7). The second parameter category, parameter category b, comprises two test parameters b1: freq=1000 and b2: freq=2000. The third parameter category, parameter category c comprises two test parameters (e.g., c1: patt=mfg and c2: patt=test). Defining the order of the parameter categories to be a, b, c, there are 17 allowed test parameter configurations: a1, b1, b2, c1, c2, a1b1, a1b2, a1c1, a1c2, b1c1, b1c2, b2c1, b2c2, a1b1c1, a1b1c2, a1b2c1, and a1b2c2.

However, only the three folded combinations may be actually measured combinations. The other combinations may rather be artificial combinations derived from the measured one in order to filter out dependencies on test parameters of specific parameter categories. Drawing a schematic representation of the respective tree data structure formed by the 17 allowed test parameter configurations may lead to a structure comprising redundant paths. In order to reduce the amount of data and reduce the complexity of the tree structure, the respective tree may be optimized in the memory and stored to a file. For this purpose, redundant information may be canceled such that for an optimized tree each parameter (e.g., base elements a, b, and c are directly connected to the root node only once). Optimizing the tree data structure, the structure of FIG. 3H may be generated. A test parameter may be assigned to each node of the tree data structure. Each tree path starting from the root node may thus resemble a test parameter configuration. Each link of the tree data structure may be assigned with a bit fail count. The optimized tree may, for example, be loaded into a database, (e.g., a database hosted in a cloud). The optimized tree of FIG. 3H may be used for a failure analysis.

In FIG. 3A, a new test parameter configuration a1b1c1 is added to the root node. The bit fail count assigned to each of the links is identical to the bit fail count of the respective test parameter configuration. In FIG. 3B the test parameter sub-combinations b1c1 and a1c1 of a1b1c1 are added. The sub-combination b1c1 is not identical to any starting segment of any existing data tree path, since the only existing path (i.e., tree path a1b1c1) starts with a1. Thus, a new tree path is generated and the bit fail count of the respective test parameter configuration is assigned to each of the links of the new tree path. Since the starting segment a1 of the test parameter configuration a1c1 is identical to the already existing tree path a1b1c1, the node c1 is added as a new branch to the existing data tree paths. Since the existing tree path already comprises a node assigned with parameter c1, the bit fail counts assigned to the links of tree path a1b1c1 are not amended, while the bit fail count of the new test parameter configuration is assigned to the link of the new branch.

Since the parameter configurations a1 and b1 are identical to starting segments of already existing data tree paths without being identical to the complete tree paths, no new nodes are added and no bit fail counts assigned to links are updated. Test parameter configuration c1 is not comprised by any of the existing data tree paths. Therefore, a new tree path is added for the respective test parameter configuration c1 from a1b1c1 as shown in FIG. 3C. In FIG. 3C, the test parameter configuration a1b1c2 is added to the already existing branch, a1b1c1, which is extended by a new branch c2. The link of the new node c2 is assigned with the bit fail count of the test parameter configuration a1b1c2. Since the respective new test parameter c2 is not already comprised of the existing data path, the links of the respective existing tree path are updated. In this embodiment, the respective existing tree path(s) are updated by adding the count of the new test parameter configuration.

For each node, the rule may be true that the bit fail count assigned to the ingoing link (i.e., the link leading to the respective node from the direction of the root node) is identical (with regard to test parameter category) to the sum of the outgoing links (i.e., links of the respective node leading away from the root node). In other words, summing up all bit fail counts assigned to links leading from the respective node to nodes of a certain category at the next hierarchy level results in the bit fail count assigned to the incoming link.

FIG. 3C is an example scenario where the incoming link of the node a1 is 90 which is equal to the sum of all outgoing links leading to nodes assigned with a frequency. In FIG. 3C, there is only one such node b1 for which the rule is true. However, the link directly leading from a1 to c1 is assigned with a bit fail count of 30 which is unequal 90. Thus there is an alleged inconsistency of the tree data structure. As it may be understood from FIG. 3C, the tree data structure comprises tree paths resembling real measurements (e.g., a1b1c1 and a1b1c2) as well artificial tree paths (e.g., a1c1, b1c1 and c1) generated using sub-combinations of the test parameter configurations of the real measurements. When sequentially generating the tree data structure, intermediate states of the tree data structure may occur which are inconsistent with the above given rule. However, these inconsistencies are only temporary and caused by the fact that for a new real measurement not all allowed sub-combinations have been taken into account yet. As soon as all sub-combinations are taken into account, the alleged inconsistencies are resolved.

FIG. 3H is an example showing a state, where the rule is satisfied. In this example, each real measurement has taken into account all allowed sub-combinations of test parameters. For node a1, the ingoing link is assigned with a bit fail count of 200. The sum of all bit fail counts of outgoing links leading to nodes assigned with a frequency (i.e. of the category frequency) are 90+110=200 and the sum of all bit fail counts of outgoing links leading to nodes assigned with a pattern (i.e., of the category pattern) are 65+135=200.

In FIG. 3D, the same procedure is performed for the new test parameter configuration b1c2 from a1b1c2 in respect to the existing tree path b1c2. Further, the new test parameter configuration a1c2 from a1b1c2 is added as a new branch to the existing tree path a1b1c2. Since the existing tree path already comprises the test parameter c2, the bit fail counts of the links of the existing tree path are not updated.

No further amendments are applied to the existing tree data structure regarding tree parameter configurations for a1 and b1 respectively, because, as previously discussed, those tree parameter configures have already been generated. However, the test parameter configuration, test parameter configuration c2, from a1b1c2 on its own is has not been added to the existing tree data structure. Therefore, in FIG. 3E, a new path comprising the respective test parameter c2 configuration is added. In FIG. 3E the test parameter configuration a1b2c1 is also added to the existing tree path a1b1c1 as a new branch. Since the existing tree path does not yet include the combination b1c1, the links of the existing path leading to the new branch are updated by adding the bit fail count of the newly added branch.

In FIG. 3F, the test parameter configuration b2c1 from a1b2c1 is added by adding a new tree path. Furthermore, the test parameter configuration a1c1 from a1b2c1 is also added. Since the test parameter configuration a1c1 is identical to an existing tree path a1c1 the respective test parameter configuration is added by updating the links of the existing tree path (e.g., by adding the bit fail count of the respective test parameter configuration to each of the bit fail counts assigned to the already existing links). Finally, the test parameter configuration c1 from a1b2c1 is added in FIG. 3F in the same manner.

In FIG. 3G, the test parameter configuration a1b2c2 is added by adding a new branch to the already existing tree path a1b1c1. Since the combination of the new branch b2c1 is not reflected in the existing tree path, the links of the existing tree path leading from the root node to the new branch are updated by the bit fail count of the new test parameter configuration. In FIG. 3G, furthermore the test parameter configuration b2c2 from a1b2c2 is added as a new branch to the already existing tree path b2c1.

In FIG. 3H, the test parameter configuration a1c2 from a1b2c2 is added to the already existing tree path a1c2. In this example, the test parameter configure a1c2 from a1b2c2 is added to the existing tree path a1cd by adding the respective bit fail count to the links of the existing tree path. In a similar manner, the test parameter configuration c2 from a1b2c2 is added in the same manner. The test parameter configurations a1b1 from a1b1c2 and a1b2 from a1b2c2 are identical to starting segments of already existing tree paths as indicated above and thus neglected for updating the tree structure.

Thus, an optimized tree structure is generated without redundant information comprised by different tree paths. In order to filter a test parameter to be neglected from the tree data structure, the respective parameter needs to be filtered in all tree paths. For example, in case c2: patt=test is to be filtered, all fail counts (e.g., 60 and 75) assigned to c2 need to be removed from all tree links as well as all nodes c2.

In FIG. 3I, the tree section comprising tree paths b1c1, b1c2, b2c1, and b2c2 of the tree data structure of FIG. 3H is shown, while all other tree paths are neglected for simplicity. In order to check whether a grouping may be applied to these tree paths in regard of the tree parameter category b (i.e., frequencies), the nodes assigned with frequencies may be selected (e.g., freq=1000 and freq=2000). These, tree parameters may be sorted by magnitude of the test parameters (i.e., frequencies) resulting in the order b1 (1000 Hz), b2 (2000 Hz), when sorted in ascending order. According to other embodiments, a descending order may be applied. The difference of bit fail counts assigned to the links leading to the respective nodes b1 and b2 $\Delta$=b1−b2=20 is positive. According to other embodiments, the difference may be defined the other way round (e.g., $\Delta$=b2−b1=−20).

In instances where the predefined allowed range of differences for grouping comprises 20, the two nodes b1 and b2 can be combined into test group G1, as shown in FIG. 3I. The combination of those tree segments extending from nodes b1 and b2 can likewise be combined to branch out from test group G1, as shown in FIG. 3I.

According to embodiments, the range may be defined for the absolute value of the difference. An additional tree path is added for the group G1. The node of group G1 is assigned with the test parameters freq=1000_freq=2000. The other grouped nodes and links leading to the respective grouped nodes are merged. The tree structure extending from the grouped nodes is optimized (i.e., merged, according to the same rules which had been applied to generate the tree data structure), as shown in FIG. 3H. Thus, the link leading to the test group G1 is assigned with the sum of the bit fail counts assigned to the grouped nodes (i.e., to the links leading to the grouped nodes). The two pairs of identical tree paths G1c1 and G1c2 are each merged according to the above identified rules.

In FIG. 3J, the tree paths comprising the group G1 of FIG. 3I are shown, all other tree paths are neglected for simplicity. In FIG. 3J, a grouping is applied to these tree paths in regard of the tree parameter category c, (i.e., the test pattern). Thus, the nodes patt=mfg and patt=test are selected and sorted. The respective test parameters may be sorted according to a predefined order of the test patterns (e.g., c1 (mfg), c2 (test)). This results in the bit fail count difference $\Delta$=c2−c1=70. In instances where 70 is within the predefined range for allowed differences, the nodes c1 and c2 are grouped as shown in FIG. 3J generating an additional tree path for the new test group G2. The respective node is assigned with the test parameters patt=mfg_patt=test.

Figure 4:
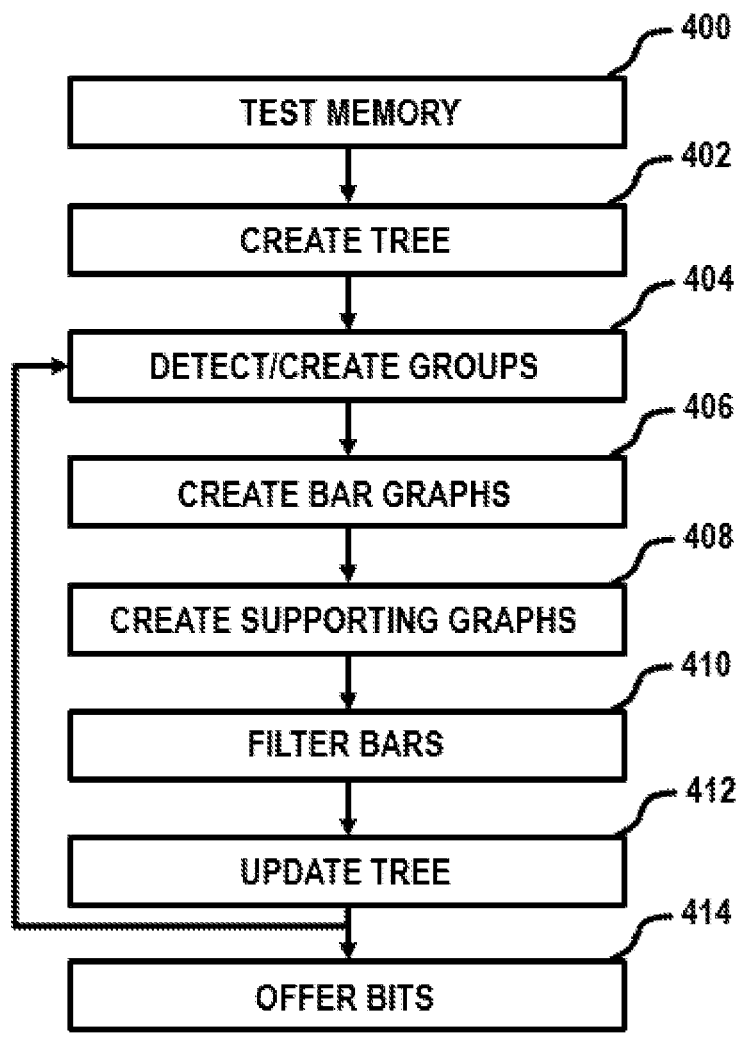
FIG. 4 depicts a schematic block diagram of an exemplary first method for testing a memory cell arrangement, in accordance with an embodiment of the present invention.

FIG. 4 depicts a schematic block diagram of an exemplary first method for testing a memory cell arrangement, in accordance with an embodiment of the present invention. In block 400, a memory cell arrangement is tested. In block 402, a relational data structure of the bit fails detected for the different test parameter configuration applied to the memory cell arrangement during testing is created. In this embodiment, the data structure created is a tree. This tree data structure represents the fail counts condition wise, wherein all combinations of test parameters are taken into account.

In block 404, groups in the tree are detected and created. Groups may be generated for a specific test parameter category upon request or systematically for the entire tree data structure. In other embodiments, the relational data structure may be any relational data structure known in the art.

In order to detect and create a group for a specific test category upon request, all first hierarchy nodes which are assigned to a test parameter of the requested test parameter category are taken into account. The bit fail counts of the respective test parameters (i.e., the bit fail counts assigned to the links leading from the respective nodes to the root node) are taken into account. The test parameters are sorted and, for each pair of adjacent sorted test parameters, the difference of the bit fail counts assigned to the respective test parameters is determined. It is started with the first sorted test parameter. If the bit fail count difference to the adjacent test parameter is within a predefined range (e.g., above a minimum level and below a maximum level), the respective test parameter (i.e., the respective node) is grouped with the adjacent test parameter (i.e., node). In instances where the difference is too small (e.g., 0) or too large, no grouping is applied. When a group is generated, the next test parameter adjacent to the last test parameter added is checked to verify whether the group needs to be added. In order to decide whether the next test parameter needs to be added, the difference between the last test parameter of the group and the respective next adjacent test parameter is considered. All differences between test parameters of the group have to be either positive or negative. Therefore, it is checked whether the difference has the right sign (i.e., that the difference is positive or negative). In instances where the respective difference has the correct sign, the respective difference is checked to verify that the difference is within the predefined range for parameters to be grouped. Where the respective difference is within the predefined range, the adjacent test parameter is also added to the group. Where the bit fail count difference has the wrong sign or a value that does not lie within the predefined range, the respective test parameter is not added to the group. Accordingly each pair of adjacent test parameters are tested to determine whether they are grouped or not.

Alternatively the whole tree data structure may be systematically grouped according to the above identified criteria in order to systematically search the complete tree data structure for test parameters to be grouped. Thus, for each node of the tree data structure all higher level nodes directly connected to the respective node by one link are taken into account. The test parameters assigned to the higher level nodes are sorted and the above described analysis is applied. Thereby, the whole tree data structure may be searched for test parameters to be grouped.

In block 406, a representation of one or more groups may be created. For example, a two-dimensional sorted bar graph may be generated for one test parameter category. In this embodiment, the y-axis may be normalized. The bar graph may comprise bars of the test groups as well as bars of individual test parameters or test parameter combinations which include the groups and/or bars of individual test parameters or test parameter combinations which have not been added to any of the test groups (e.g., due to a wrong sign of the respective bit fail count difference or a difference beyond the predefined range). In this embodiment, the height of the bars may represent the normalized bit fail count of the respective test parameter and the bars may be sorted according to their height (i.e., their bit fail count).

In block 408, the information displayed in the sorted bar graph of block 406 may be analyzed in further detail. In this embodiment the information displayed may be analyzed by selecting one of the bars and generate a second sorted bar graph for the respective test parameter taking into account a second test parameter category.

In block 410, filters may be applied to the sorted bar graph generated in block 406. For example, bars resembling an expected bit fail behavior may be filtered out. A filter may, for example, be a certain pattern of the bit fail counts. In an example, regarding voltages, it may be expected that there are more fails for low voltages and the amount of fails decreases with rising voltages until a working range of the memory cells is reached, wherein the number of fails should be more or less constant (i.e., a working range). Increasing the voltage beyond the working range increases the likelihood of experiencing more fails. In this instance, all bars which are distributed according to this general pattern may be ignored. Only bars that do not meet the pattern should be taken into account, which do not comply with the expectation, (e.g., a group of test parameters with a positive gradient of the bit fail counts at the beginning of the voltage range).

In block 412, the tree in the memory may be updated according to the filters applied in block 410. In this embodiment, the nodes filtered out may either be deleted or labeled as irrelevant. Optionally, additional groups in the tree can be detected and created.

In block 414, bits are offered, based on the bars which have not been filtered (i.e., bars that show a relevant behavior which is unexpected). In this embodiment, the bars which have not been filtered may be used in order to identify single cells or sets of cells of the memory cell arrangement to be analyzed in more detail and to be potentially modified in order to avoid the detected behavior. For this purpose, the bit fail count file may additionally include structural information about the distribution of the malfunctioning memory cells (i.e., a bit fail map).

Figure 5:
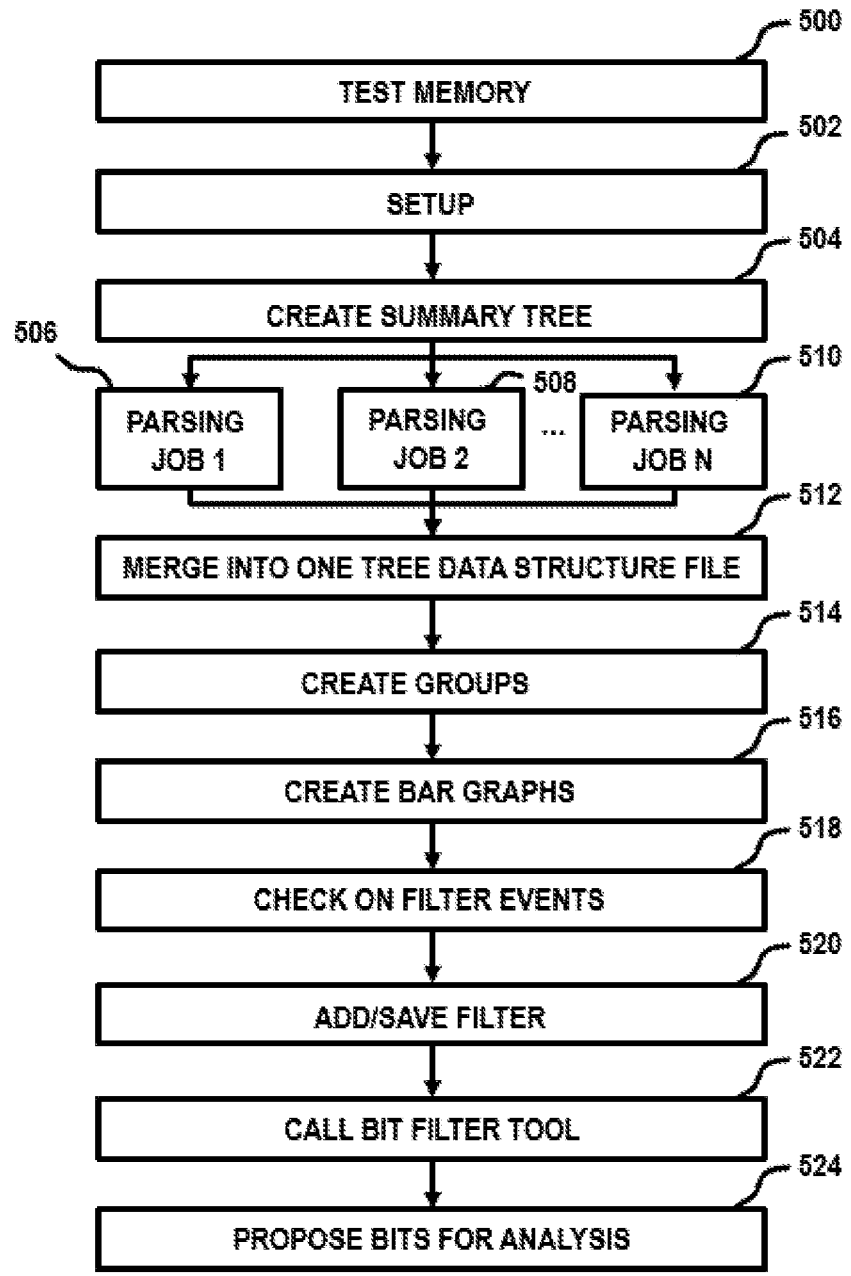
FIG. 5 depicts a schematic block diagram of an exemplary second method for testing a memory cell arrangement, in accordance with an embodiment of the present invention.

FIG. 5 depicts a schematic block diagram of an exemplary second method for testing a memory cell arrangement, in accordance with an embodiment of the present invention.

In block 500, memory cell arrangement is tested. In block 502, the received data may be set up. In block 504 the tree data structure is created. In this embodiment, the respective tree data structure may be done in parallel as shown in blocks 506, 508 and 510 (e.g., using a cloud computing infrastructure and Hadoop). In block 512, the results of the parallel calculations are merged into one tree data structure file. In block 514, groups are created. In block 516, sorted bar graphs may be created. In block 518, filter events may be checked. In this embodiment, the respective filter may either be a filter already stored for the respective analysis or a newly defined filter which is then added to the set of stored filters in block 520. In block 522, the bit filter tool is called. In this embodiment, the bit filter tool can apply the bit filters. Finally, in block 524, bits for further analysis or modifications may be proposed based on the result of the filter tool filtering for relevant events.

An example pseudocode for group creation may look as follows:
Example Pseudocode 1
start at the top of tree, i.e., at the root node;
iterate through each test parameters name assigned to the nodes;
if there is more than one characteristic, strings may e.g. be sorted with respect to similarity;
   numeric elements are sorted;
   assign a default gradient;
   group already created?
   if not, determine gradient between current and next bar, i.e., node, according to the order used for sorting, gradients may either be negative, zero or positive; decide whether gradient is
     a) greater than min threshold and
     b) smaller than max limit
   if check is successful, create a new group;
     set a meta-flag on each bar which belongs to new group;
   if a group is already created and gradient changes, e.g., from positive to negative, then group building is finished;
   if group is already created and sign as well as min/max rules still apply
     add more bars, i.e., nodes, to the same group;
   if last bar, i.e., node, is reached, then finish group building;
   switch to next parallel tree path;
   step deeper into the tree and assign a new start value for the repeating analysis identified above This code may be applied recursively. Here, the differences of bit fail counts are taken into account by the gradient grad=$\Delta$BFC/$\Delta$bar=$\Delta$BFC, since the respective bars are adjacent bars, $\Delta$bar=1.

Figure 6:
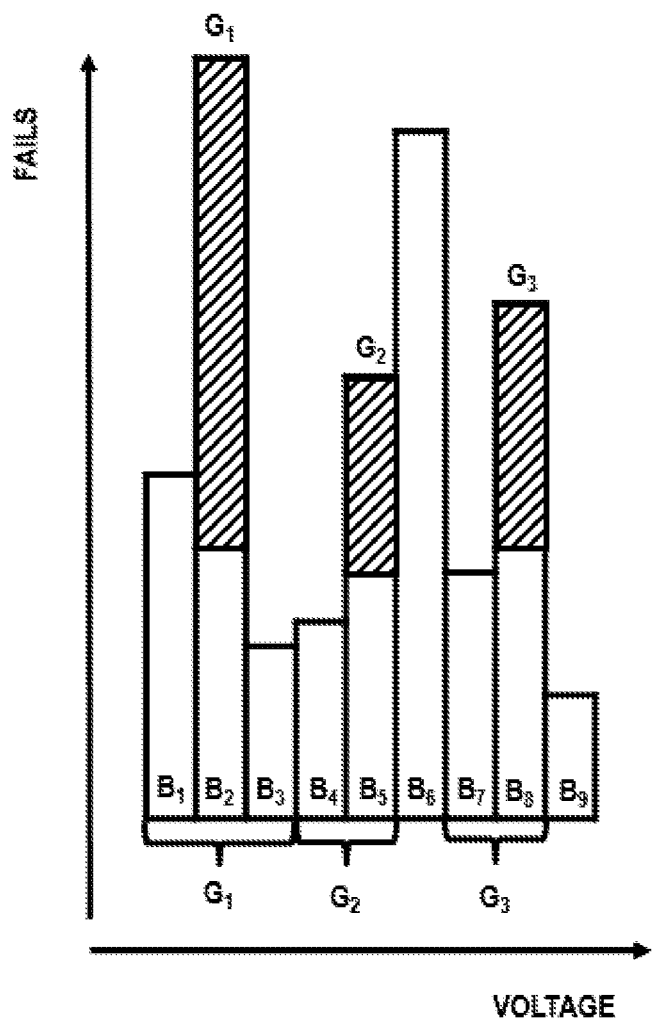
FIG. 6 depicts a first schematic diagram illustrating a first exemplary two dimensional bar diagram representing bit fail counts, in accordance with an embodiment of the present invention.

FIG. 6 depicts a first schematic diagram illustrating a first exemplary two dimensional bar diagram representing bit fail counts, in accordance with an embodiment of the present invention. Specifically, FIG. 6 depicts a schematic diagram illustrating an exemplary bar graph. The x-axis is assigned to a test parameter category (e.g., a voltage). The nine bars, bars $B_1$ to $B_9$, depicted are sorted according to the voltage assigned (e.g., the bar $B_1$ is assigned with the lowest voltage, while the bar $B_9$ is assigned with the highest voltage). The grouping algorithm, as previously discussed, is applied to these nine bars, bars $B_1$ to $B_9$. In this example, the height of the bars represents the bit fail count assigned to the respective test parameter. The first three bars, bars $B_1$ to $B_3$, are grouped together as group $G_1$, because the relative differences between these bars (i.e., the gradients are negative, which means that the bit fail count is successively decreasing). Bars $B_4$ and $B_5$ are grouped together in a new group $G_2$ because their bit fail count difference is rising in contrary to the differences of group $G_1$. The next bar, bar $B_6$, may not be grouped with any other bar, since the differences to the bit fail counts of adjacent bars, (e.g., $B_5$ and $B_7$) are so large that it may lie beyond the predefined range. Bar $B_6$ may indicate an unexpected singular rise of malfunction memory cells and be relevant on its own. Bars $B_7$ and $B_8$ may be grouped forming a third group $G_3$, while the bar $B_9$ may not be grouped with any other bars. The respective groups, groups $G_1$, $G_2$, and $G_3$ may be added to the graph, wherein each bar representing a group is the sum of the bit fail counts of the test parameters grouped together.

Printing a sorted graph of the tree as shown in FIG. 6 requires walking through the tree starting at the root. All first hierarchy elements which are connected directly to the root may be printed on their own. All second hierarchy elements and the first hierarchy elements along with their connections may be also be printed. In other instances, all third, second hierarchy and first hierarchy elements and their connections (via the root) may be printed. As previously discussed with regard to the tree data structure shown FIG. 3 H, the following may be examples how to label the x-axis: 'vdd:0.700' or 'vdd:0.700_freq:1000' or 'vdd:0.700_freq:1000_patt:mfg' or 'freq:1000' or 'freq:1000_patt:mfg'.

Bit layout information may be stored together with fail count information. When it comes to the task to offer some bits for testing, the BFC (i.e., bit fail count) change (i.e., difference) may be used as an indicator for test parameter configurations for which bits may be identified. The BFC change may be calculated by a subtracting an amount of cells available in the log file for a first configuration from another amount of cells available in the log file for a second configuration. If the difference is zero, this may indicate that there is not enough meta-data in the BFM (bit fail map) log file to find a bit with that certain characteristic. Responsive to calculating the different is zero, that piece of information may be put back to the test system and the test may be run again with deeper data logging enabled.

In instances where the differences considered for grouping are small and no group is built in the create grouping step (e.g., step 514 of FIG. 5), either a retest may be required on proposed bits only or a change in the min/max threshold levels for difference detection may be performed.

Advantages of sorted bar diagram may include being able to filter known or explainable fails. The grouping allows identifying and focusing on interesting points in a huge amount of bars available. After the filtering, the remaining bars are to be tested and diagnosed in more detail. Bars which do not belong to a group, but show sufficiently high fails may also be taken into account.

Figure 7:
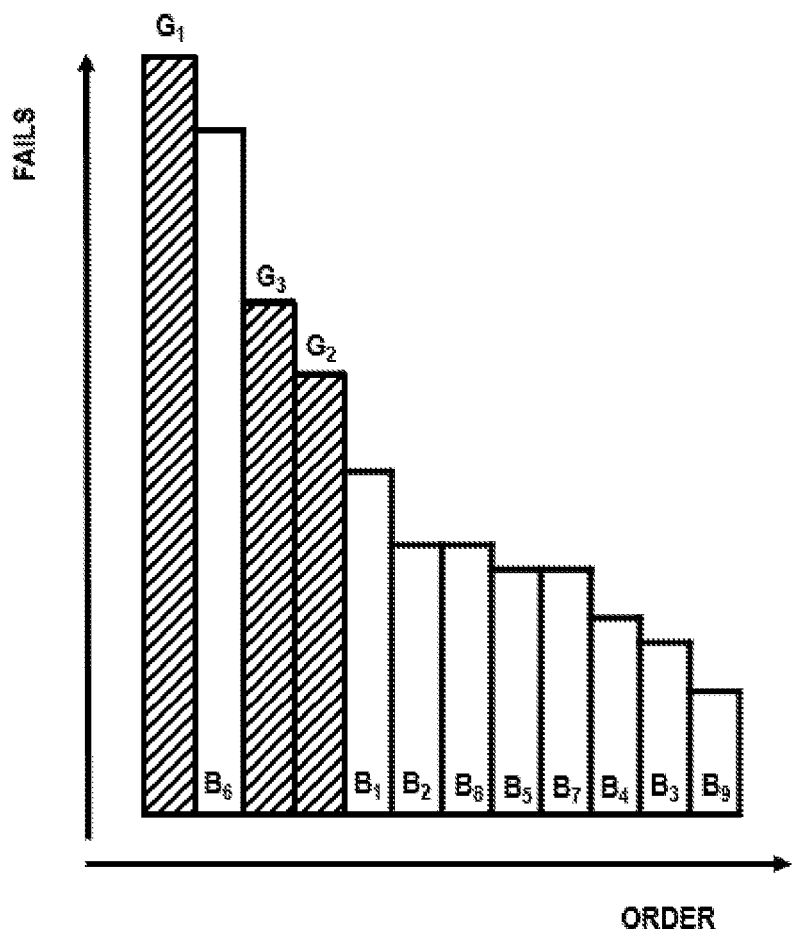
FIG. 7 depicts a second schematic diagram illustrating a second exemplary two dimensional bar diagram representing bit fail counts, in accordance with an embodiment of the present invention.

FIG. 7 depicts a second schematic diagram illustrating a second example two dimensional bar diagram representing bit fail counts, in accordance with an embodiment of the present invention.

In FIG. 7, the resulting bars of FIG. 6 are sorted according to their height. The first bars may be the most relevant ones, since they comprise the most fail counts. However, for example, group $G_1$ may simply be explained due to the fact that the voltage is too low. Accordingly, the respective bar $G_1$, even though is large, may be neglected as well as the single bars $B_1$, $B_2$ and $B_3$. Bar $B_6$ may be highly relevant on its own. Group $G_3$ comprising $B_7$ and $B_8$ may be explained due to the fact that the voltage is rising and such becoming too large, which may explain the observed bit fail counts. Accordingly, the bars $G_3$, $B_7$ and $B_8$ may also be neglected. $G_2$ may be taken into account because the respective bit fail counts are raising voltage region resembles the working range of the memory cells, where a rather low increase may be expected. Bar $B_9$ may be taken into account even though it is the smallest one because the voltage is decreasing in the high voltage region, where the number of failure detections may rather be expected to increasing.

FIG. 8 depicts a schematic diagram illustrating an exemplary three dimensional diagram representing bit fail counts, in accordance with an embodiment of the present invention. Specifically, FIG. 8 depicts a second schematic diagram providing an alternative exemplary representation of bit fail bars as shown in FIG. 6.

In FIG. 8, two voltages are taken into account. In this example, a three-dimensional representation is provided. The bars A to G are assigned with pairs of voltages from the two test parameter categories voltage vdd and voltage vcs. Each pair of test parameters to be taken into account for this representation is chosen such that each one of the test parameters is larger than the corresponding one of the pair of test parameters of the previous bar. The third dimension may either be provided by a z-axis (not shown) or by a color indicator (not shown) or numeric indicator indicating the bit fail count assigned to each of the bars A to G. This representation allows to efficiently take into account two different test parameter categories at once. Based on a filtering of the bars shown, relevant pairs of voltages may be selected and for one or both voltages a further analysis based on an approach according to FIGS. 6 and 7 may be applied.

Figure 9:
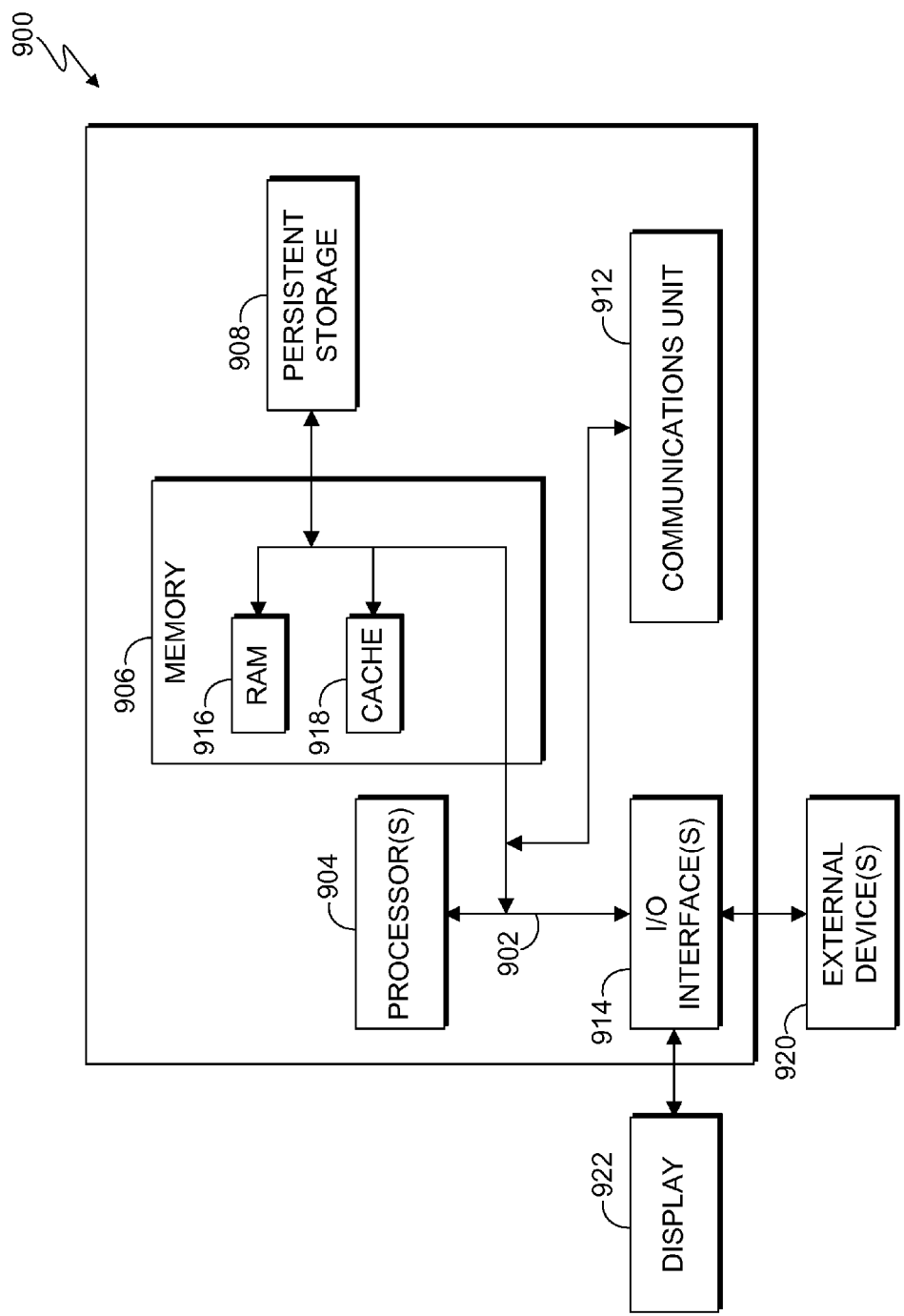
FIG. 9 is a block diagram of internal and external components of a computer system, in accordance with an embodiment of the present invention.

FIG. 9 is a block diagram of internal and external components of a computer system 900, which is representative the computer systems capable of performing operational steps of the methods described above, in accordance with an embodiment of the present invention. It should be appreciated that FIG. 9 provides only an illustration of one implementation and does not imply any limitations with regard to the environments in which different embodiments may be implemented. In general, the components illustrated in FIG. 9 are representative of any electronic device capable of executing machine-readable program instructions. Examples of computer systems, environments, and/or configurations that may be represented by the components illustrated in FIG. 9 include, but are not limited to, personal computer systems, server computer systems, thin clients, thick clients, laptop computer systems, tablet computer systems, cellular telephones (e.g., smart phones), multiprocessor systems, microprocessor-based systems, network PCs, minicomputer systems, mainframe computer systems, and distributed cloud computing environments that include any of the above systems or devices.

Computer system 900 includes communications fabric 902, which provides for communications between one or more processors 904, memory 906, persistent storage 908, communications unit 912, and one or more input/output (I/O) interfaces 914. Communications fabric 902 can be implemented with any architecture designed for passing data and/ or control information between processors (such as microprocessors, communications and network processors, etc.), system memory, peripheral devices, and any other hardware components within a system. For example, communications fabric 902 can be implemented with one or more buses.

Memory 906 and persistent storage 908 are computer-readable storage media. In this embodiment, memory 906 includes random access memory (RAM) 916 and cache memory 818. In general, memory 806 can include any suitable volatile or non-volatile computer-readable storage media. Software is stored in persistent storage 908 for execution and/or access by one or more of the respective processors 904 via one or more memories of memory 906.

Persistent storage 908 may include, for example, a plurality of magnetic hard disk drives. Alternatively, or in addition to magnetic hard disk drives, persistent storage 908 can include one or more solid state hard drives, semiconductor storage devices, read-only memories (ROM), erasable programmable read-only memories (EPROM), flash memories, or any other computer-readable storage media that is capable of storing program instructions or digital information.

The media used by persistent storage 908 can also be removable. For example, a removable hard drive can be used for persistent storage 808. Other examples include optical and magnetic disks, thumb drives, and smart cards that are inserted into a drive for transfer onto another computer-readable storage medium that is also part of persistent storage 908.

Communications unit 912 provides for communications with other computer systems or devices via a network. In this exemplary embodiment, communications unit 912 includes network adapters or interfaces such as a TCP/IP adapter cards, wireless Wi-Fi interface cards, or 3G or 4G wireless interface cards or other wired or wireless communication links. The network can comprise, for example, copper wires, optical fibers, wireless transmission, routers, firewalls, switches, gateway computers and/or edge servers. Software and data used to practice embodiments of the present invention can be downloaded to a computer system through communications unit 912 (e.g., via the Internet, a local area network or other wide area network). From communications unit 912, the software and data can be loaded onto persistent storage 908.

One or more I/O interfaces 914 allow for input and output of data with other devices that may be connected to computer system 900. For example, I/O interface 914 can provide a connection to one or more external devices 920 such as a keyboard, computer mouse, touch screen, virtual keyboard, touch pad, pointing device, or other human interface devices. External devices 920 can also include portable computer-readable storage media such as, for example, thumb drives, portable optical or magnetic disks, and memory cards. I/O interface 914 also connects to display 922.

Display 922 provides a mechanism to display data to a user and can be, for example, a computer monitor. Display 922 can also be an incorporated display and may function as a touch screen, such as a built-in display of a tablet computer.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A computer-implemented method comprising:
    checking memory cells of a memory cell arrangement with a sequence of test parameter configurations for a malfunction using test parameters from different parameter categories;
    storing test parameter configurations for which a malfunction is detected;
    assigning each of the stored test parameter configurations with a bit fail count comprising a number of malfunctioning memory cells;
    defining an order for the stored test parameter configurations;
    creating a relational data structure comprising a plurality of interlinked nodes and a root node such that each test parameter configuration of the test parameter configurations is represented by a path, wherein the test parameters associated with the respective test parameter configurations are assigned to one or more nodes of the plurality of interlinked nodes of the path according to the defined order starting from the root node with the bit fail count detected for the respective test parameter configuration being assigned to the respective path;
    combining one or more segments of the relational data structure according to a predefined rule for obtaining one or more test groups;
    creating a representation of the bit fail counts of the respective test groups;
    applying a filter to the relational data structure including the test groups in order to identify test parameter configurations categories to be further analyzed;
    storing, for each test parameter configurations for which a malfunction is detected, a bit fail map comprising information about a spatial distribution pattern of the malfunctioning memory cells; and
    determining a spatial distribution pattern of memory cells to be further analyzed using the parameter configuration categories to be further analyzed and the bit fail map.

2. The computer-implemented method of claim 1, further comprising:
    responsive to detecting a bit fail, adding respective paths for the associated test parameter configuration.

3. The computer-implemented method of claim 1, wherein creating a relational data structure comprises:
    generating, for each stored test parameter configuration, a set of test parameter sub-combinations comprising all sub-combinations of the test parameter configurations of the respective stored test parameter configurations in accordance with a predefined order, wherein each sub-combination of the test parameter configurations of the respective stored test parameter configurations is neglected;
    assigning to each test parameter sub-combination the bit fail count of the respective test parameter configuration; and
    extending the relational data structure such that each test parameter sub-combination is represented by a path with the test parameters of the respective sub-combination being assigned to the nodes of the path according to the defined order starting from the root node and with the bit fail count of the respective sub-combination assigned to the respective path.

4. The computer-implemented method of claim 1, wherein creating a relational data structure comprises:
    for each path to be generated checking whether the relational data structure already comprises a path assigned with an identical starting combination of test parameters;
    in case no path assigned with an identical starting combination of test parameters is detected, generating the respective path starting at a root node independently of existing paths; and
    assigning the bit fail count of the respective path to each link comprised by the respective path.

5. The computer-implemented method of claim 4, further comprising:
   upon detecting one or more paths assigned with an identical starting combination of test parameters, merging the respective path to be generated with one of the detected paths; and
   merging the respective path to be generated with the detected path comprising the largest identical starting combination of test parameters.

6. The computer-implemented method of claim 5, further comprising:
   checking whether the complete test parameter combination of the detected path comprising the largest identical starting combination of test parameters is identical to the complete test parameter combination of the respective path to be generated; and
   upon detecting a respective complete identity, merging the respective path to be generated with the respective detected path by adding the bit fail count of the respective path to be generated to each link of the respective detected path.

7. The computer-implemented method of claim 5, further comprising:
   checking whether the complete test parameter combination of the respective path to be generated is identical to the starting test parameter combination of the detected path comprising the largest identical starting combination without being identical to the complete test parameter combination of to the respective detected path; and
   upon detecting a respective partial identity, neglecting the respective path to be generated.

8. The computer-implemented method of claim 5, further comprising:
   checking whether the detected path comprising the largest identical starting combination of test parameters comprises all test parameters of the respective path to be generated without being identical to the test parameter combination of the respective path to be generated and without the respective starting combination being identical to the test parameter combination of the respective path to be generated; and
   upon detecting a respective identity, merging the respective path to be generated with the respective detected path by adding to the detected path at the last node of the respective starting combination a branch comprising nodes assigned with the test parameters not comprised by the respective starting combination such that the path from the root node to the end of the respective branch comprises all test parameters of the respective path to be generated.

9. The computer-implemented method of claim 5, further comprising:
   checking whether the detected path comprising the largest identical starting combination of test parameters is not comprising all test parameters of to the respective path to be generated; and
   upon detecting that the respective detected path does not comprise all test parameters of the respective path to be generated, merging the respective path to be generated with the respective detected path by adding to the detected path at the last node of the respective starting combination a branch comprising nodes assigned with the test parameters not comprised by the respective starting combination such that the path from the root node to the end of the respective branch comprises all test parameters of the respective path to be generated and adding the bit fail count of the respective path to be generated to each link of the respective branch and the respective starting combination.

10. The computer-implemented method of claim 1, wherein combining one or more segments of the relational data structure according to a predefined rule for obtaining one or more test groups comprises:
    selecting segments to be combined by using differences of bit fail counts assigned to the segments as a selection criterion.

11. The computer-implemented method of claim 10, wherein the predefined rule for a first parameter category comprises:
    selecting a first set of nodes comprising all nodes of the first hierarchy level of the relational data structure assigned with a first test parameter from the first parameter category;
    sorting the first test parameters assigned to the nodes of the first set;
    for each pair of adjacent test parameters of the sorted first test parameters determining the difference of the two bit fail counts assigned to the links leading directly to the nodes assigned with the respective adjacent test parameters; and
    combining the nodes of the first set into test groups such that the differences calculated for the nodes of each test group are all positive or all negative and within a predefined range.

12. The computer-implemented method of claim 11, further comprising:
    for each test group obtained, generating an additional segment by copying all segments starting with a link leading directly to one of the nodes of the first set of nodes and merging the first links and nodes of the copied segments, adding up the bit fail counts assigned to merged links and assigning the merged nodes with a test group ID of the respective test group.

13. The computer-implemented method of claim 12, further comprising:
    extending the grouping with respect to a second parameter category;
    selecting a second set of nodes comprising all nodes of the next level of hierarchy of the additional segment following the merged nodes which are assigned with a second test parameter from the second parameter category;
    sorting the second test parameters assigned to the nodes of the second set;
    for each pair of adjacent test parameters of the sorted second test parameters determining the difference of the two bit fail counts assigned to the links leading directly to the nodes assigned with the respective adjacent test parameters; and
    combining the nodes of the second set into test groups such that the differences calculated for the nodes of each test group are all positive or all negative and within a predefined range.

14. The computer-implemented method of claim 13, wherein combining the nodes of the second set into test groups such that the differences calculated for the nodes of each test group are all positive or all negative and within a predefined range comprises:
    for each test group obtained generating an additional segment by copying the segments starting with a link leading directly to one of the nodes of the second set of nodes and merging the first links and nodes of the copied segments, adding up the bit fail counts assigned to merged links and assigning the merged nodes with a test group ID of the respective test group.

15. The computer-implemented method of claim 11, further comprising:
displaying a representation of all bit fail counts assigned to the links leading directly to the nodes of the first set.

16. The computer-implemented method of claim 15, wherein the representation is a bar diagram wherein a y-axis depicts representing bit fail counts.

17. A computer program product comprising:
one or more computer readable storage media and program instructions stored on the one or more computer readable storage media, the program instructions comprising:
program instructions to checking memory cells of a memory cell arrangement with a sequence of test parameter configurations for a malfunction using test parameters from different parameter categories;
program instructions to storing test parameter configurations for which a malfunction is detected;
program instructions to assigning each of the stored test parameter configurations with a bit fail count comprising a number of malfunctioning memory cells;
program instructions to define an order for the stored test parameter configurations;
program instructions to create a relational data structure comprising a plurality of interlinked nodes and a root node such that each test parameter configuration of the test parameter configurations is represented by a path, wherein the test parameters associated with the respective test parameter configurations are assigned to one or more nodes of the plurality of interlinked nodes of the path according to the defined order starting from the root node with the bit fail count detected for the respective test parameter configuration being assigned to the respective path;
program instructions to combine one or more segments of the relational data structure according to a predefined rule for obtaining one or more test groups;
program instructions to create a representation of the bit fail counts of the respective test groups;
program instructions to apply a filter to the relational data structure including the test groups in order to identify test parameter configurations categories to be further analyzed;
program instructions to store, for each test parameter configurations for which a malfunction is detected, a bit fail map comprising information about a spatial distribution pattern of the malfunctioning memory cells; and
program instructions to determine a spatial distribution pattern of memory cells to be further analyzed using the parameter configuration categories to be further analyzed and the bit fail map.

18. The computer program product of claim 17, wherein the program instructions stored on the one or more computer readable storage media further comprise:
program instructions to, responsive to detecting a bit fail, add respective paths for the associated test parameter configuration.

19. The computer program product of claim 17, wherein the program instructions to create a relational data structure comprise:
program instructions to generate, for each stored test parameter configuration, a set of test parameter sub-combinations comprising all sub-combinations of the test parameter configurations of the respective stored test parameter configurations in accordance with a predefined order, wherein each sub-combination of the test parameter configurations of the respective stored test parameter configurations is neglected;
program instructions to assign to each test parameter sub-combination the bit fail count of the respective test parameter configuration; and
program instructions to extend the relational data structure such that each test parameter sub-combination is represented by a path with the test parameters of the respective sub-combination being assigned to the nodes of the path according to the defined order starting from the root node and with the bit fail count of the respective sub-combination assigned to the respective path.

20. A computer system comprising:
one or more computer processors;
one or more computer readable storage media; and
program instructions stored on the one or more computer readable storage media for execution by at least one of the one or more computer processors, the program instructions comprising:
program instructions to checking memory cells of a memory cell arrangement with a sequence of test parameter configurations for a malfunction using test parameters from different parameter categories;
program instructions to storing test parameter configurations for which a malfunction is detected;
program instructions to assigning each of the stored test parameter configurations with a bit fail count comprising a number of malfunctioning memory cells;
program instructions to define an order for the stored test parameter configurations;
program instructions to create a relational data structure comprising a plurality of interlinked nodes and a root node such that each test parameter configuration of the test parameter configurations is represented by a path, wherein the test parameters associated with the respective test parameter configurations are assigned to one or more nodes of the plurality of interlinked nodes of the path according to the defined order starting from the root node with the bit fail count detected for the respective test parameter configuration being assigned to the respective path;
program instructions to combine one or more segments of the relational data structure according to a predefined rule for obtaining one or more test groups;
program instructions to create a representation of the bit fail counts of the respective test groups;
program instructions to apply a filter to the relational data structure including the test groups in order to identify test parameter configurations categories to be further analyzed;
program instructions to store, for each test parameter configurations for which a malfunction is detected, a bit fail map comprising information about a spatial distribution pattern of the malfunctioning memory cells; and
program instructions to determine a spatial distribution pattern of memory cells to be further analyzed using the parameter configuration categories to be further analyzed and the bit fail map.

\* \* \* \* \*